(12) United States Patent
Hu et al.

(10) Patent No.: US 11,726,180 B2
(45) Date of Patent: Aug. 15, 2023

(54) LIGHT EMITTING MODULE, LIGHT EMITTING UNIT, OPTICAL SIGNAL DETECTION MODULE, OPTICAL SYSTEM AND LASER RADAR SYSTEM

(71) Applicant: Leishen Intelligent System Co., Ltd., Guangdong (CN)

(72) Inventors: Xiaobo Hu, Guangdong (CN); Sunguang Liu, Guangdong (CN); Ying Liu, Guangdong (CN)

(73) Assignee: LEISHEN INTELLIGENT SYSTEM CO., LTD., Guangdong (CN)

( * ) Notice: Subject to any disclaimer, the term of this patent is extended or adjusted under 35 U.S.C. 154(b) by 429 days.

(21) Appl. No.: 16/972,686

(22) PCT Filed: May 27, 2019

(86) PCT No.: PCT/CN2019/088567
§ 371 (c)(1),
(2) Date: Dec. 7, 2020

(87) PCT Pub. No.: WO2019/237911
PCT Pub. Date: Dec. 19, 2019

(65) Prior Publication Data
US 2021/0247495 A1 Aug. 12, 2021

(30) Foreign Application Priority Data

Jun. 11, 2018 (CN) .......................... 201810595306.4

(51) Int. Cl.
*G01C 3/08* (2006.01)
*G01S 7/481* (2006.01)
(Continued)

(52) U.S. Cl.
CPC .......... *G01S 7/4814* (2013.01); *G01S 7/4812* (2013.01); *G01S 7/4861* (2013.01);
(Continued)

(58) Field of Classification Search
None
See application file for complete search history.

(56) References Cited

U.S. PATENT DOCUMENTS

| 5,500,762 A | 3/1996 | Uchiyama et al. |
| 2014/0233013 A1* | 8/2014 | Sakimura .............. G01S 7/4815 356/5.01 |

(Continued)

FOREIGN PATENT DOCUMENTS

| CN | 105814451 A * | 7/2016 | ........... G01S 7/4815 |
| CN | 106559142 A | 4/2017 | |

(Continued)

OTHER PUBLICATIONS

CHINA Intellectual Property Search Report International Application PCT/CN2019/088567, dated Aug. 28, 2019.

*Primary Examiner* — Mark Hellner
(74) *Attorney, Agent, or Firm* — Taft Stettinius & Hollister LLP; Stephen F. Rost

(57) ABSTRACT

Provided are a light emitting module, a optical signal detection unit, an optical system and a laser radar system. The light emitting module comprises: a high-frequency modulation signal output unit (10), which is configured to output at least two preset high-frequency modulation signals with different frequencies; a laser emitting unit (20), which is connected with the high-frequency modulation signal output unit (10), and is configured to emit at least two laser beams with different frequencies after being respectively modulated by at least two high-frequency modulation signals with different frequencies; a reference signal emitting unit (30), which is connected with the high-frequency modulation signal output unit (10), and is configured to emit at least two reference signals with different frequencies after (Continued)

being respectively modulated by at least two high-frequency modulation signals with different frequencies.

20 Claims, 10 Drawing Sheets

(51) Int. Cl.
*H01S 5/02253* (2021.01)
*G01S 7/4861* (2020.01)
*H01S 5/00* (2006.01)
*G01S 17/10* (2020.01)

(52) U.S. Cl.
CPC ........ *H01S 5/0085* (2013.01); *H01S 5/02253* (2021.01); *G01S 17/10* (2013.01)

(56) References Cited

U.S. PATENT DOCUMENTS

2017/0307648 A1* 10/2017 Kotake .................. G01S 7/484
2019/0293794 A1* 9/2019 Zhang .................. G01S 7/4817

FOREIGN PATENT DOCUMENTS

| CN | 107015232 A | 8/2017 |
| CN | 107515405 | 12/2017 |
| CN | 108828615 A | 11/2018 |
| CN | 208421237 U | 1/2019 |
| WO | 2016043036 A1 | 3/2016 |

\* cited by examiner

LIGHT EMITTING MODULE, LIGHT EMITTING UNIT, OPTICAL SIGNAL DETECTION MODULE, OPTICAL SYSTEM AND LASER RADAR SYSTEM

CROSS REFERENCE

The present application claims priority from a Chinese patent application, with application number 201810595306.4, filed with the Chinese Patent Office on Jun. 11, 2018, the entire contents of which are incorporated herein by reference.

TECHNICAL FIELD

The embodiments of the present application relate to the field of laser ranging technology, for example, to a light emitting module, a light emitting unit, an optical signal detection module, an optical system, and a laser radar system.

BACKGROUND

A laser radar system is a radar system that emits a laser beam (detection optical signal) to detect a targets position, velocity, and other characteristic quantities. The laser radar system can detect relevant information of the target object, such as the targets orientation, distance, height, speed, attitude, and even shape parameters, so as to detect, track and identify the target object. Laser radar systems are essential core sensors in the fields of automotive autopilot, robot positioning and navigation, space environment mapping, and security. In practical applications, according to different principles, laser radar systems can be divided into: triangle-based laser radar systems, time-flight based pulsed laser radar systems, and phase-based laser radar systems. Among them, the phase-based laser radar system achieves the measurement of the distance of the to be measured target object by loading a sinusoidal modulation signal of a certain frequency onto a laser, and using the distance information contained in the phase difference between the transmitted signal (probe optical signal) and the received signal (echo signal).

However, the higher the frequency of the detection optical signal, the higher the detection accuracy, the smaller the detection range, while the lower the frequency of the detection optical signal, the lower the detection accuracy, and the larger the detection range. In the related art, distance measurement of a target object with both high detection accuracy and large detection range cannot be achieved.

SUMMARY

The present application provides a light emitting module, a light emitting unit, an optical signal detection module, an optical system, and a laser radar system, which realize distance measurement of a target object with both high detection accuracy and large detection range.

In a first aspect, an embodiment of the present application provides a light emitting module, where the light emitting module comprises:

a high-frequency modulation signal output unit, configured to output at least two preset high-frequency modulation signals with different frequencies;

a laser emitting unit, connected to the high-frequency modulation signal output unit, and configured to emit at least two laser beams with different frequencies respectively modulated by the at least two preset high-frequency modulation signals with different frequencies; and a reference signal transmitting unit, connected to the high-frequency modulation signal output unit, and configured to emit at least two reference signals with different frequencies after being respectively modulated by the at least two preset high-frequency modulation signals with different frequencies.

In a second aspect, an embodiment of the present application provides a light emitting unit, comprising a light source subunit, a high-frequency modulation subunit, and a difference frequency subunit;

the light source subunit is configured to emit an initial light beam;

the high-frequency modulation subunit is configured to perform frequency modulation on the initial light beam by using an optical mixing technology to transmit at least two high-frequency transmission signals with different frequencies;

the difference frequency subunit is configured to perform difference frequency processing on any two high-frequency transmission signals with different frequencies, and transmit at least one low-frequency transmission signal; and wherein, at least one of the high-frequency transmission signals and at least one of the low-frequency transmission signals are transmitted by the light emitting unit as detection light signals.

In a third aspect, an embodiment of the present application provides an optical signal detection module, comprising a signal receiving unit and a signal processing unit which are electrically connected;

wherein, the signal receiving unit is configured to receive a first reference signal, a second reference signal, a first high-frequency echo signal, and a second high-frequency echo signal; the first reference signal is a reference signal modulated by a first high-frequency modulation signal, the second reference signal is a reference signal modulated by a second high-frequency modulation signal; the first high-frequency echo signal is a laser beam after the first laser beam is reflected by a target object, and the second high-frequency echo signal is a laser beam after the second laser beam is reflected by the target object; the first laser beam is a laser beam modulated by the first high-frequency modulation signal, and the second laser beam is a laser beam modulated by the second high-frequency modulation signal; and the frequency of the first high-frequency modulation signal is greater than that of the second high-frequency modulation signal; and the signal processing unit is configured to: obtain a first reference distance value of the target object according to a first phase difference between the first reference signal and the first high-frequency echo signal; and obtain a second reference distance value of the target object according to the first phase difference and a second phase difference, and determine a measurement distance value of the target object according to the first reference distance value and the second reference distance value; and the second phase difference is a phase difference between the second reference signal and the second high-frequency echo signal.

In a fourth aspect, an embodiment of the present application provides an optical system, comprising the light emitting module provided in the first aspect, and the signal receiving unit provided in the second aspect.

In a fifth aspect, an embodiment of the present application provides a laser radar system, comprising the light emitting module provided in the first aspect, and the optical signal detection module provided in the second aspect.

In the light emitting module provided in embodiments of the present application, at least two preset high-frequency modulation signals with different frequencies are output by a high-frequency modulation signal output unit, and loaded onto a laser emitting unit to allow the laser emitting unit to emit at least two laser beams with different frequencies, which are used to detect the same distance, ensuring both the measurement accuracy and the measurement range.

DETAILED DESCRIPTION

The present application will be described in the following with reference to the drawings and embodiments. It can be understood that the specific embodiments described herein are only used to explain rather than limiting the present application. It should also be noted that, for convenience of description, the drawings only show a part of rather than the whole structure related to the present application.

The light emitting module and the optical signal detection module provided in the embodiments of the present application can be applied to a laser radar system. The light emitting module and the optical signal detection module will be described below in combination with application scenarios.

Figure 1:
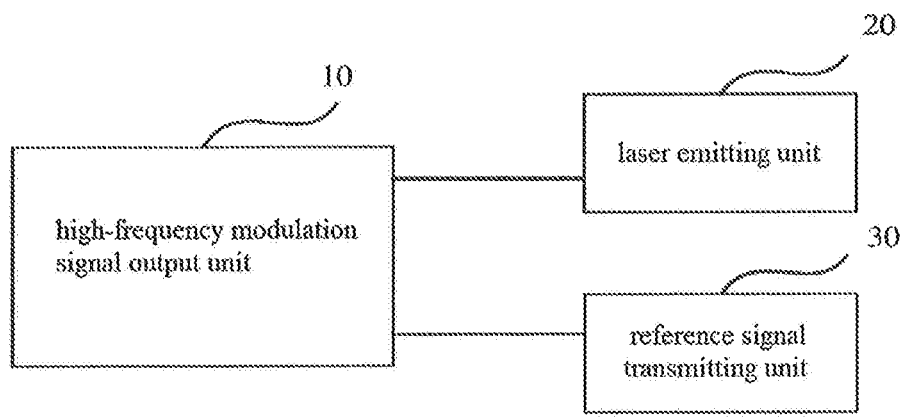
FIG. 1 is a schematic structural diagram of a light emitting module provided by an embodiment of the present application.

FIG. 1 is a schematic structural diagram of a light emitting module according to an embodiment. Referring to FIG. 1, the light emitting module comprises a high-frequency modulation signal output unit 10, a laser emitting unit 20, and a reference signal transmission unit 30.

In an embodiment, the high-frequency modulation signal output unit 10 is configured to output at least two preset high-frequency modulation signals with different frequencies; the laser emitting unit 20 is connected to the high-frequency modulation signal output unit 10, and configured to emit at least two laser beams with different frequencies respectively modulated by the at least two preset high-frequency modulation signals with different frequencies; the reference signal transmitting unit 30 is connected to the high-frequency modulation signal output unit 10 and configured to emit at least two reference signals with different frequencies after being respectively modulated by the at least two preset high-frequency modulation signals with different frequencies.

In an embodiment, each high-frequency modulation signal is a master oscillator signal; the high-frequency modulation signal output unit 10 is further configured to output at least two local oscillator signals with different frequencies, the at least two local oscillator signals correspond to at least two master oscillator signals respectively, and each local oscillator signal differs from a master oscillator signal by a preset frequency.

In an embodiment, the high-frequency modulation signal output unit 10 comprises at least two phase-locked loops, and each phase-locked loop is configured to output a master oscillator signal and a local oscillation signal corresponding to the master oscillator signal.

In an embodiment, the absolute value of the difference between the frequencies of the different master oscillator signals is within a preset frequency range, for example, 0 MHz-50 MHz.

In an embodiment, the at least two reference signals of different frequencies are at least two reference laser beams of different frequencies or at least two reference electrical signals of different frequencies.

In an embodiment, in a case where the at least two reference signals of different frequencies are at least two reference laser beams of different frequencies, the at least two reference signals may be transmitted by a laser emitting unit.

In an embodiment, the high-frequency modulation signal output unit 10 comprises three phase-locked loops. Each phase-locked loop can output a group of high-frequency modulation signals, so the three phase-locked loops can output three groups of high-frequency modulation signal with different frequencies. The phase-locked loop (PLL) is a feedback control circuit.

In this embodiment, a group of high-frequency modulation signals comprises a master oscillator signal and a local oscillation signal corresponding to the master oscillator signal.

It can be understood that in other embodiments, a Direct Digital Synthesizer (DDS) may be used in the high-frequency modulation signal output unit 10 to replace the phase-locked loop.

Figure 2:
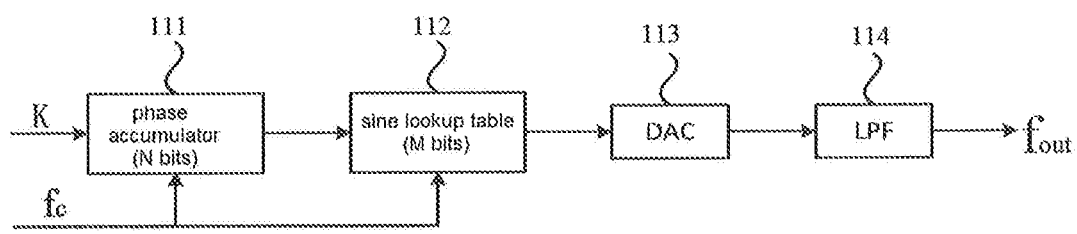
FIG. 2 is a schematic diagram of a working principle of a frequency synthesizer provided by an embodiment of the present application.

Exemplarily, FIG. 2 is a schematic diagram of a working principle of a DDS provided by an embodiment. Referring to FIG. 2, the DDS comprises a phase accumulator 111, a sine lookup table 112, a Digital-to-Analog Converter (DAC) 113, and a low pass filter (LTP) 114. At the same time, clock signals fc are input to the phase accumulator 111 and the sine lookup table 112, respectively, and a frequency control word K is input to the phase accumulator 111.

Among them, the phase accumulator 111 is the core of the DDS. The phase accumulator 111 is composed of an N-bit binary adder and an N-bit register sampled by the clock signal fc, and is used to linearly accumulate the frequency control word K (decimal). The phase accumulator 111 is configured to implement phase accumulation and store the accumulation result. A cycle of action is completed and overflow occurs when the accumulation reaches a full amount of the phase accumulator 111. This cycle is a frequency cycle of the DDS system for synthesizing signals, and the overflow-frequency of the phase accumulator 111 is the frequency of the output signal.

The sine lookup table 112 is programmable read-only memory that stores the sampled and encoded value of a periodic sine signal with phase as the address, and contains the digital amplitude information of a periodic sine wave. Each address corresponds to a phase point of a 0-2π range (phases from 0 to 2π are equally divided into M parts).

The function of the digital-to-analog converter 113 is to convert a digital signal into an analog signal. In an embodiment, a sequence of sine amplitude values is converted into a sine wave. In addition, higher resolution of the digital-to-analog converter 113 may cause better continuity of the output sine wave. When the resolution of the digital-to-analog converter 113 is low, the output sine wave is a trapezoidal waveform. After being filtered by the filter 114 (the low-pass filter may also be a band-pass filter), it becomes an analog waveform fout whose quality (here, mainly referring to the continuity of the waveform) meets the requirements. Here, the frequency of the output analog waveform fout can be changed by changing the clock signal fc, the number of bits N of the phase accumulator 111 or the number of bits M of the sine lookup table 112.

In an embodiment, the laser emitting unit 20 may comprise a laser, and the laser is configured to emit a laser beam with good collimation and energy concentration. Exemplarily, the laser may be a semiconductor laser, a fiber laser, a gas laser, or a solid-state laser.

In an embodiment, the wavelength of the laser beam transmitted by the laser may be 635 nanometers (nm), 650 nm, 780 nm, 792 nm, or 850 nm.

In an embodiment, the laser emitting unit 20 comprises a laser diode, such as a low-power continuous laser diode in the infrared band.

The low power here refers to the power on the milliwatt level. Low power, on one hand, can prevent the heat generated by the laser emitting unit 20 from affecting the performance of the electrical components in the light emitting module and peripheral circuits, at the same time, the laser generated by the low-power laser diode is a type of safe laser, and is harmless to human body, especially the human eye, and on the other hand, the low power can reduce costs.

Figure 3:
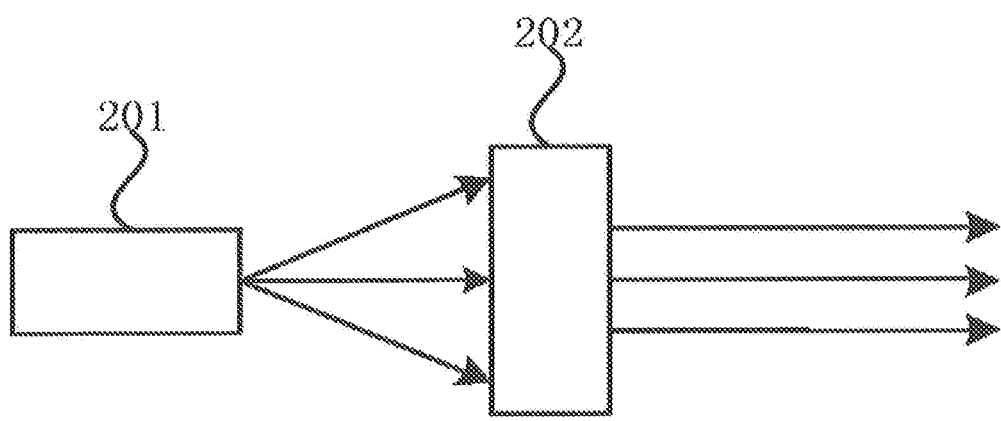
FIG. 3 is a schematic structural diagram of a laser emitting unit provided by an embodiment of the present application.

FIG. 3 is a schematic structural diagram of a laser emitting unit according to an embodiment. Referring to FIG. 3, the laser emitting unit 20 comprises a laser diode 201 and a collimating lens 202 which are sequentially arranged along a propagation direction of the light beam; the collimating lens 202 is configured to perform collimation to a laser beam emitted from the laser diode 201. The energy of the laser beam collimated by the collimating lens 202 is more concentrated, so that the transmitted laser spot is very small.

It should be noted that, FIG. 3 only exemplarily shows that the laser emitting unit 20 comprises a collimating lens 202. In other embodiments, a collimating lens 202 may be provided between any two optical elements in the beam propagation path to reduce the divergence angle of the beam, or a collimating element is provided directly inside the laser diode 201, which is not limited herein. In an embodiment, the collimating lens 202 may be a spherical lens.

Exemplarily, the frequencies of three groups of preset high-frequency modulation signals with different frequencies output by the high-frequency modulation signal output unit 10 are: a master oscillator signal fg1=193 MHz, a local oscillation signal fg1'=192 MHz, and a master oscillator signal fg2=187 MHz, the local oscillator signal fg2'=186 MHz; the master oscillator signal fg3=167 MHz and the local oscillator signal fg3'=166 MHz. After being loaded with the master oscillator signal in each group of high-frequency modulation signals, the laser emitting unit 20 can emit a laser beam of a corresponding frequency.

It should be noted that, the specific frequency values of the three groups of high-frequency modulation signals are merely exemplary rather than limitative descriptions; at the same time, the number of groups of high-frequency modulation signals output by the high-frequency modulation signal output unit 10 is merely exemplary rather than limitative descriptions, for example, more than two or more than four groups of high-frequency modulation signals can also be output. In other embodiments, the selection of the frequency value of the high-frequency modulation signal can be set according to the actual requirements of the laser radar system for the light emitting module, which is not strictly limited herein.

The light emitting module provided in the embodiment of the present application outputs at least two preset high-frequency modulation signal of different frequencies through the high-frequency modulation signal output unit 10, and loads the high-frequency modulation signal to the laser emitting unit so that the laser emitting unit emits at least two laser beams of different frequencies, which are used to detect the same distance, thereby ensuring the measurement accuracy and measurement range.

The light emitting module provided by the foregoing embodiment emits a laser beam modulated by a high-frequency modulation signal as a detection optical signal, or the light emitting module emits a laser beam modulated by a high-frequency modulation signal as a detection optical signal and a reference optical signal, respectively, wherein the optical signal is reflected by the target object to form an echo signal related to the distance of the target object.

In the phase-based laser radar system in the related art, electrical components are used to modulate the frequency of a transmitted signal, at a low modulation speed, and the electromagnetic interference is serious, resulting in slow detection speed of the existing phase-based laser radar system.

Figure 4:
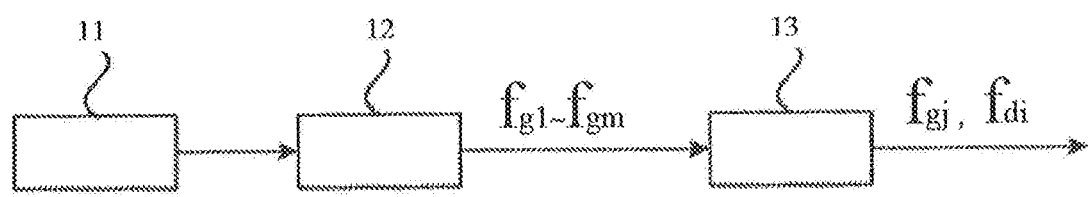
FIG. 4 is a schematic structural diagram of a light emitting unit provided by an embodiment of the present application.

FIG. 4 is a schematic structural diagram of a light emitting unit according to an embodiment of the present disclosure. Referring to FIG. 4, the light emitting unit comprises: a light source subunit 11, a high-frequency modulation subunit 12, and a difference frequency subunit 13; the light source subunit 11 is configured to emit an initial light beam; and the high-frequency modulation subunit 12 is configured to perform frequency modulation on the initial beam by photomixing technique, and emits at least two high-frequency transmission signals with different frequencies fg1 to fgm (where m is an integer greater than or equal to 2); the difference frequency subunit 13 is configured to perform differential frequency processing to the at least two high-frequency transmission signals with different frequencies, and transmit at least one low-frequency transmission signal fdi (where i is an integer greater than or equal to 1); wherein, at least one high-frequency transmission signal fgj (where 1≤j≤m) and at least one low-frequency transmission signal fdi is transmitted by the light emission unit and used as a detection optical signal.

In an embodiment, the light source subunit 11 may comprise a laser, which is configured to emit a laser beam with good collimation and energy concentration. Exemplarily, the laser may be a semiconductor laser, a fiber laser, a gas laser, or a solid-state laser.

Exemplarily, the frequencies of the high-frequency transmission signals obtained by modulating the initial beam by the high-frequency modulation subunit 12 may be fg1=194 MHz, fg2=190 MHz, fg3=185 MHz, and fg4=179 MHz, and the difference frequency subunit 12 performs difference frequency processing to any two signals of fg1, fg2, fg3, and fg4, and the obtained low-frequency transmission signals can be fd1=4 MHz, fd2=5 MHz, fd3=6 MHz, fd4=9 MHz, fd5=11 MHz, and fd6=15 MHz, wherein the value of m is 4 and the value of i is up to 6. The detection optical signal transmitted by the light emitting unit comprises at least one of the above-mentioned four types of high-frequency transmission signals and at least one of the above-mentioned six types of low-frequency transmission signals.

Exemplarily, the detection optical signal may comprise a high-frequency transmission signal of 194 MHz and a low-frequency transmission signal of 4 MHz; alternatively, the detection optical signal may comprise high-frequency transmission signals of 194 MHz and 185 MHz, and low-frequency transmission signals of 4 MHz and 15 MHz.

It should be noted that, the specific frequency values of the above-mentioned high-frequency transmission signals and low-frequency transmission signals are merely exemplary and not limitative descriptions; at the same time, the selection of the frequency values of the detection optical signals is only exemplary and not limitative descriptions. In other embodiments, the frequency of the high-frequency transmission signal and the low-frequency transmission signal, and the selection of the frequency f the detection optical signal can be set according to actual requirements of the light-emitting unit by the laser radar system.

The light emitting unit provided in the embodiment of the present disclosure modulates the initial light beam through the optical mixing technology by the high-frequency modulation subunit 12. Compared with the use of electrical components to modulate the initial beam, the modulation speed is faster, and the high-frequency transmission signal has a high-frequency. When the light emitting unit is applied to a laser radar system, the detection accuracy of the laser radar system can be improved. The difference frequency subunit 13 obtains a low-frequency transmission signal through difference-frequency processing. Compared to directly obtaining the difference-frequency transmission signal by modulating the initial beam, there is no need to modulate a new low-frequency transmission signal according to a complete modulation process, thereby reducing the configuration time, and improves the modulation speed of the low-frequency transmission signal. Therefore, the light emitting unit provided in the embodiment of the present disclosure accelerates the modulation speed of the detection optical signal, thereby increasing the transmission speed of the detection optical signal, thereby improving the detection speed of the laser radar system.

At the same time, the light emitting unit emits at least one high-frequency transmitting signal and at least one low-frequency transmitting signal as detection optical signals, that is, it emits at least two transmission signals with different frequencies as detection optical signals (also known as multi-ruler measuring technology, the detection optical signal of each frequency corresponds to a measuring ruler, wherein the high-frequency transmission signal corresponds to a fine ruler, the low-frequency transmission signal corresponds to a rough ruler, and intermediate-frequency transmission signals correspond to a medium ruler.) The higher the frequency of the detection optical signal, the higher the detection accuracy of the laser radar system, and the lower the frequency of the detection optical signal, the farther the detection distance of the laser radar system can be. Therefore, the light emitting unit provided in this embodiment uses a high-frequency transmission signal to ensure the detection accuracy of the laser radar system, and a low-frequency transmission signal to ensure the detection range of the laser radar system. The data of the detection results of the high-frequency transmission signal and the low-frequency transmission signal are fused, to obtain a distance value with a larger range and higher accuracy. At the same time, this laser radar system, which can ignore the influence of frequency shift in the entire system, also has the characteristics of higher stability, longer detection distance and higher accuracy when measuring with traditional multi-ruler measuring technology.

In addition, using optical mixing technology to obtain high-frequency transmission signals and using differential frequency technology to obtain low-frequency transmission signals avoid the problem that the detection optical signals are opt to be affected by electromagnetic signals when using electrical components to modulate the beam. Therefore, the stability of the detection optical signal is high.

In an embodiment, the high-frequency modulation subunit 12 comprises a frequency synthesizer; the frequency synthesizer is configured to load at least two preset different high-frequency values onto the initial beam transmitted by the light source subunit through direct digital frequency synthesis technique, so as to form at least two high-frequency transmission signals with different frequencies.

In an embodiment, Direct Digital Frequency Synthesis (DDS or DDFS) is called third-generation frequency synthesis technology, which refers to a technology that generates a series of digital signals and converts them to analog signals through a digital-to-analog converter. That is, a new frequency synthesis technology that directly synthesizes the required waveform according to the concept of "phase".

In an embodiment, the light source subunit comprises a low-power continuous laser diode.

The power of the light source subunit is low, on one hand, it can prevent the light source subunit from generating much heat, which affects the performance of the electrical components in the light emitting unit and in the peripheral circuits; on the other hand, it can reduce the cost.

In an embodiment, the light source subunit 11 further comprises a collimating lens, and the low-power continuous laser diode and the collimating lens are sequentially arranged along the propagation direction of the light beam; and the collimating lens is configured to collimate the initial beam transmitted by the low-power continuous laser diode.

Figure 5:
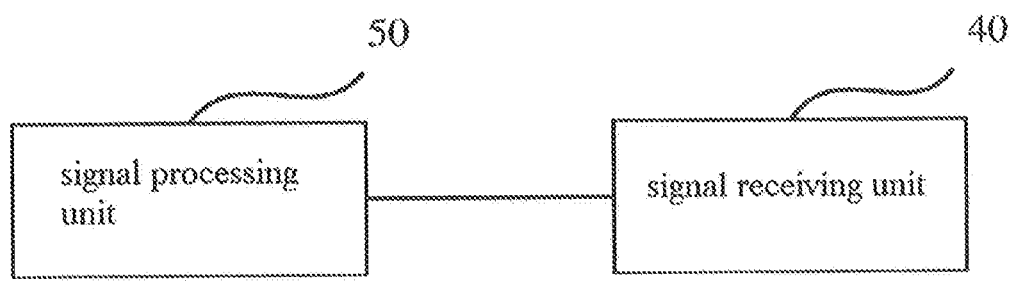
FIG. 5 is a schematic structural diagram of an optical signal detection module provided by an embodiment of the present application.

An embodiment of the present application further provides an optical signal detection module for detecting an echo signal. FIG. 5 is a schematic structural diagram of an optical signal detection module according to an embodiment of the present application. Referring to FIG. 5, the optical signal detection module comprises a signal receiving unit 40 and a signal processing unit 50.

In an embodiment, the at least two high-frequency modulation signals of different frequencies comprise a first high-frequency modulation signal and a second high-frequency modulation signal. The signal receiving unit 40 is configured to receive a first reference signal, a second reference signal, and a first high-frequency echo signal and a second high-frequency echo signal; wherein the first reference signal is a reference signal modulated by the first high-frequency modulation signal, and the second reference signal is a reference signal modulated by the second high-frequency modulation signal; the first high-frequency echo signal is the laser beam after the first laser beam is reflected by the target object, and the second high-frequency echo signal is the laser beam after the second laser beam is reflected by the target object; the first laser beam is the laser beam modulated by the first high-frequency modulation signal, and the second laser beam is the laser beam modulated by the second high-frequency modulation signal; and the frequency of the first high-frequency modulation signal is greater than that of the second high-frequency modulation signal. The signal processing unit 50 is configured to obtain a first reference distance value of the target object according to a first phase difference between the first reference signal and the first high-frequency echo signal, acquire a second reference distance value of the target object according to the first reference distance value and the second reference distance value, and determine a measurement distance value of the target object according to the first reference distance value and the second reference distance value; wherein the second phase difference is a phase difference between the second reference signal and the second high-frequency echo signal.

Exemplarily, the first reference distance and the second reference distance may be fused to obtain the measurement distance of the target object, for example, the sum of the first reference distance and the second reference distance is used as the measurement distance of the target object.

In an embodiment, the signal receiving unit 40 is connected to the laser emitting unit 20 and the reference signal emitting unit 30 in the light emitting module of the above embodiment, and the first high-frequency modulation signal is the high-frequency modulation signal with the highest-frequency among the at least two high-frequency modulation signals of different frequencies output by the high-frequency modulation signal output unit 10. The second high-frequency modulation signal is all the high-frequency modulation signals other than the high-frequency modulation signal with the highest-frequency among the at least two high-frequency modulation signals of different frequencies output by the high-frequency modulation signal output unit 10. There may be one or more of the second high-frequency modulation signals, and the first reference signal is a signal transmitted by the reference signal transmitting unit 30 and modulated by the first high-frequency modulation signal. The second reference signal is a signal transmitted by the reference signal transmitting unit 30 and modulated by the second high-frequency modulation signal, and the first laser beam is a laser beam emitted by the laser transmitting unit 20 and modulated by the first high-frequency modulation signal, and the second laser beam is a laser beam emitted by the laser emitting unit 20 and modulated by the second high-frequency modulation signal.

In an embodiment, when there are multiple second high-frequency modulation signals, there are multiple second laser beams and second reference signals, and multiple second high-frequency echo signals can be respectively acquired through the multiple second laser beams, and a second phase difference between each of the multiple second high-frequency echo signals and a second reference signal corresponding to the second high-frequency echo signal can be obtained separately, and a second reference distance value can be obtained according to a plurality of second phase differences and a first phase difference, for example, a plurality of second reference distance values are respectively obtained according to a third phase difference between each of multiple second phase difference and the first phase difference, and a measurement distance value of the target object is determined according to the first reference distance value and the plurality of second reference distance values.

In an embodiment, the first reference signal and the second reference signal are the first reference laser beam and the second reference laser beam, respectively, or the first reference electrical signal or the second reference electrical signal, respectively.

In an embodiment, the signal receiving unit 40 is further configured to receive the first local oscillator signal; convert the first high-frequency echo signal into a corresponding electrical signal, and mix the electrical signal corresponding to the first high-frequency echo signal with the first local oscillator signal to obtain a first differential frequency measurement signal; convert the first reference laser beam into a corresponding electrical signal and mix the electrical signal corresponding to the first reference laser beam with the first local oscillator signal, or mix the first reference electrical signal with the first local oscillator signal to obtain a first differential frequency reference signal; receive a second local oscillator signal, convert the second high-frequency echo signal into a corresponding electrical signal, and mix the electrical signal corresponding to the second high-frequency echo signal with the second local oscillator signal to obtain a second differential frequency measurement signal; convert the second reference laser beam into a corresponding electrical signal and mix the electrical signal corresponding to the second reference laser beam with the second local oscillator signal, or mix the second reference electrical signal with the second local oscillator signal to obtain a second differential frequency reference signal; wherein the first high-frequency modulation signal is a first master oscillator signal, and the second high-frequency modulation signal is a second master oscillator signal, the frequency of the first master oscillator signal differs from the frequency of the first local oscillation signal by a preset frequency, and the frequency of the second master oscillator signal differs from the frequency of the second local oscillation signal by the preset frequency; the signal processing unit 50 is configured to obtain the first reference distance value of the target object according to the first phase difference between the first reference signal and the first high-frequency echo signal by: comparing the first differential frequency measurement signal with the first differential frequency reference signal to obtain the first phase difference, and obtaining the first reference distance value of the target object according to the first phase difference; the signal processing unit 50 is configured to obtain the second reference distance value of the target object according to the first phase difference and the second phase difference by comparing the second differential frequency measurement signal with the second differential frequency reference signals to obtain the second phase difference; calculating a third phase difference between the second phase difference and the first phase difference; and obtaining the second reference distance value of the target object according to the third phase difference.

In this embodiment, the first local oscillator signal is a local oscillator signal corresponding to the first master oscillator signal output by the modulation signal output unit 10, and the second local oscillator signal is a local oscillator signal corresponding to the second master oscillator signal output by the modulation signal output unit 10.

In this embodiment, the signal receiving unit 40 is configured to receive a high-frequency echo signal reflected by the target object, convert the high-frequency echo signal into a high-frequency electrical signal, and then convert the high-frequency electrical signal into a low-frequency electrical signal; and the signal processing unit 50 is configured to convert a low-frequency analog electrical signal into a low-frequency digital signal and obtain phase information by using a correlation algorithm, thereby obtaining a distance value of the target object.

In the process of converting the high-frequency electrical signal into a low-frequency electrical signal, the signal receiving unit 40 actually adopts a differential-frequency phase-detection technology, referring to a technology that converts a high-frequency signal into a low-frequency signal while maintaining phase information, and then uses the low-frequency signal for phase detection.

Figure 6:
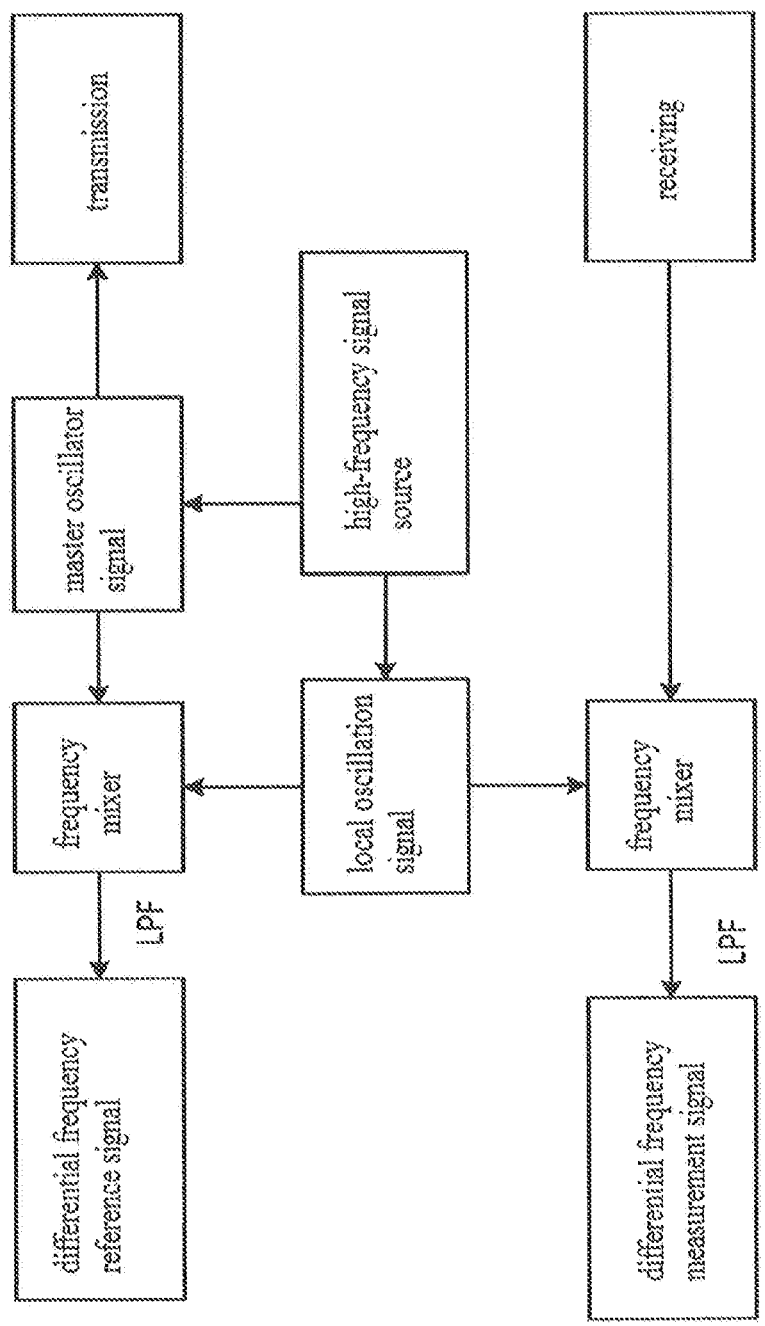
FIG. 6 is a schematic diagram of a principle of a differential frequency phase detection technology provided by an embodiment of the present application.

FIG. 6 is a schematic diagram of the technical principle of a differential-frequency phase-detection technology according to an embodiment. Referring to FIG. 6, the high-frequency modulation signal output unit in the light emitting module is equivalent to a high-frequency signal source. Each group of high-frequency modulation signals output by the high-frequency signal source comprises a master oscillator signal and a local oscillator signal differing from the master oscillator signal by a fixed frequency (for example 1 MHZ). In this embodiment, the first phase difference in the above embodiment is taken as an example. The first master oscillator signal is loaded on the laser beam and transmitted to reach the target object, and the target object reflects the laser beam to the signal receiving unit of the optical signal detection module. The signal receiving unit receives the first high-frequency echo signal obtained by the laser beam reflected by the target object, converts the first high-frequency echo signal into a high-frequency electrical signal, and mixes the high-frequency electrical signal and the first local oscillator signal, to obtain a low-frequency first differential frequency measurement signal.

The signal processing unit in the optical signal detection module is configured to obtain a first phase difference by comparing the first differential frequency measurement signal with the first differential frequency reference signal, and obtain a first reference distance value of the target object with the first phase difference. The first differential frequency reference signal is obtained by mixing an electrical signal corresponding to the laser beam modulated by the first master oscillator signal or the electrical signal modulated by the first master oscillator signal with the first local oscillation signal.

In this embodiment, the principle of obtaining the second phase difference is the same as the principle of obtaining the first phase difference, and will not be repeated herein. After obtaining the second phase difference, a third phase difference between the second phase difference and the first phase difference can be calculated, and then a second reference distance of the target object is obtained, and the measurement distance of the object target is obtained according to the first reference distance and the second reference distance.

In an embodiment, before the measurement distance of the target object is determined according to the first reference distance and the second reference distance, the signal processing unit 40 may be further configured to obtain the third reference distance value of the target object according to the second phase difference, and a fourth reference distance value is calculated according to the third reference distance value and the first reference distance value to replace the first reference distance value.

In an embodiment, an average value of the third reference distance value and the first reference distance value may be used as the fourth reference distance value, or the fourth reference distance value may be determined in some other ways, such as using look up table.

In this embodiment, the phase difference between the differential frequency measurement signal and the high-frequency echo signal is the phase of the local oscillator signal, and the phase difference between the master oscillator signal and the differential frequency reference signal is also the phase of the local oscillator signal. Therefore, the phase difference between the differential frequency measurement signal and the differential frequency reference signal is equal to the phase difference between the high-frequency echo signal and the master oscillator signal, that is, because the phase information remains unchanged, the high-frequency signal can be converted to low-frequency signal which is used for phase detection, thereby reducing the requirement for analog-to-digital conversion chips, in other words, reducing the bandwidth of the post-processing circuit. As the bandwidth is narrower, the phase detection accuracy is higher, which is conducive to improving the phase detection accuracy, i.e., improving the processing accuracy of high-frequency echo signals by the optical signal detection module. On the other hand, due to the reciprocal relationship between frequency and period, the differential-frequency phase-detection technology reduces the frequency of the signal to be measured, broadening the period thereof; and because the low-frequency signal processing technology is more mature than the high-frequency signal processing technology, converting high-frequency signals to low-frequency ones can improve phase measurement resolution and thereby improve phase detection accuracy.

Exemplarily, the complete process of emitting and detecting the optical signal shown in FIG. 6 is: the master oscillator signal ($\omega t+\varphi 1$) and local oscillator signal ($\omega_c t+\varphi 2$) generated by the high-frequency signal source are both high-frequency signals, but with different phases and frequencies, the difference frequency is a low-frequency signal. The master oscillator signal ($\omega t+\varphi 1$) is loaded on the laser beam and transmitted to the target object and reflected by the target object to form a high-frequency echo signal ($\omega t+\varphi 1+\Delta\varphi$) to be received by a signal receiving unit. The high-frequency echo signal ($\omega t+\varphi 1+\Delta\varphi$) has the same frequency as the master oscillator signal ($\omega t+\varphi 1$), and the phase changes with an amount correlated with the distance of the target object. The high-frequency echo signal ($\omega t+\varphi 1+\Delta\varphi$) is mixed with the local oscillator signal ($\omega_c t+\varphi 2$), before passing through a Low-Pass Filter (LPF) to generate a low-frequency differential frequency measurement signal (($\omega+\omega_c)t+\varphi 1-\varphi 2+\Delta\varphi$). And the generated differential frequency reference signal is processed in a path that: the master oscillator signal ($\omega t+\varphi 1$) is mixed with the local oscillator signal ($\omega_c t+\varphi 2$), and passes through the LPF to generate a low-frequency differential frequency reference signal (($\omega+\omega_c)t+\varphi 1-\varphi 2$), and the signal processing unit compares the low-frequency differential frequency measurement signal (($\omega+\omega_c)t+\varphi 1-\varphi 2+\Delta\varphi$) with the low-frequency differential frequency reference signal (($\omega+\omega_c)t+\varphi 1-\varphi 2$), and detects phase information of the differential frequency measurement signal and the differential frequency reference signal respectively and calculates the phase difference, which is equal to the phase difference between the high-frequency master oscillator signal ($\omega t+\varphi 1$) and the high-frequency echo signal ($\omega 1+\varphi 1+\Delta\varphi$). Therefore, the phase difference information carried by the high-frequency signal can be obtained by subsequently processing the low-frequency signal, thereby finally obtaining the measurement distance value of the target object.

Figure 7:
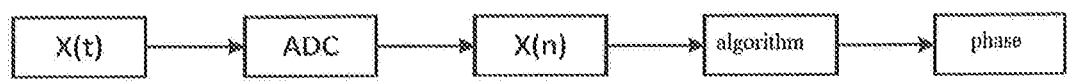
FIG. 7 is a schematic flowchart of a digital phase detection technology provided by an embodiment of the present application.

In an embodiment, the signal processing unit uses a digital phase detection method to detect phase information. The digital phase detection method is a method of digitizing a signal to be detected and then identifying phase information of the signal. Exemplarily, FIG. 7 is a schematic flowchart of a digital phase detection method provided by an embodiment of the present application. Referring to FIG. 7, the flow of the digital phase detection method comprises: converting an analog signal x(t) to be detected into a digital signal x(n) (where n is a positive integer) through analog-to-digital conversion, and then obtaining the phase information with a related algorithm. In an embodiment, the core processing unit of the digital phase detection method may be a computer or a microprocessor. The above-mentioned digital phase detection method does not depend on circuits, and the entire phase detection process is completely digitized, avoiding the influence of electromagnetic interference existing in the circuit on the phase detection result, so that it has good anti-interference ability, and further has high phase detection accuracy. At the same time, the operation is fast and the processing unit has a small volume. Applying the digital phase detection method to the laser radar system can improve the speed and accuracy (also called resolution) of the measurement distance by the laser radar system.

It should be noted that the "high-frequency" mentioned in the above embodiment refers to a frequency with a level of 100 MHz (for example, 100 MHZ or more), and the "low-frequency" mentioned in the present application refers to a frequency with a level of MHz (for example, 1 MHZ-10 MHZ).

In an embodiment, the signal receiving unit 40 comprises a photodetector.

With this arrangement, the photodetector is used to realize the functions of receiving, converting, and mixing the first reference signal, the second reference signal, the first high-frequency echo signal, and the second high-frequency echo signal. Therefore, the optical signal detection module has a reduced number of components, a simplified structure, and a reduced volume. The application of the photodetector in the laser radar systems is conducive to the miniaturization design thereof.

It should be noted that the above-mentioned photodetector is only a design for the signal receiving unit, and is not limited. In other embodiments, the receiving, converting, and mixing functions may also be implemented by two or three components. The functions implemented by multiple components are relatively independent. When an abnormal signal is detected, it can be quickly checked and the cost of replacing components is low.

Figure 8:
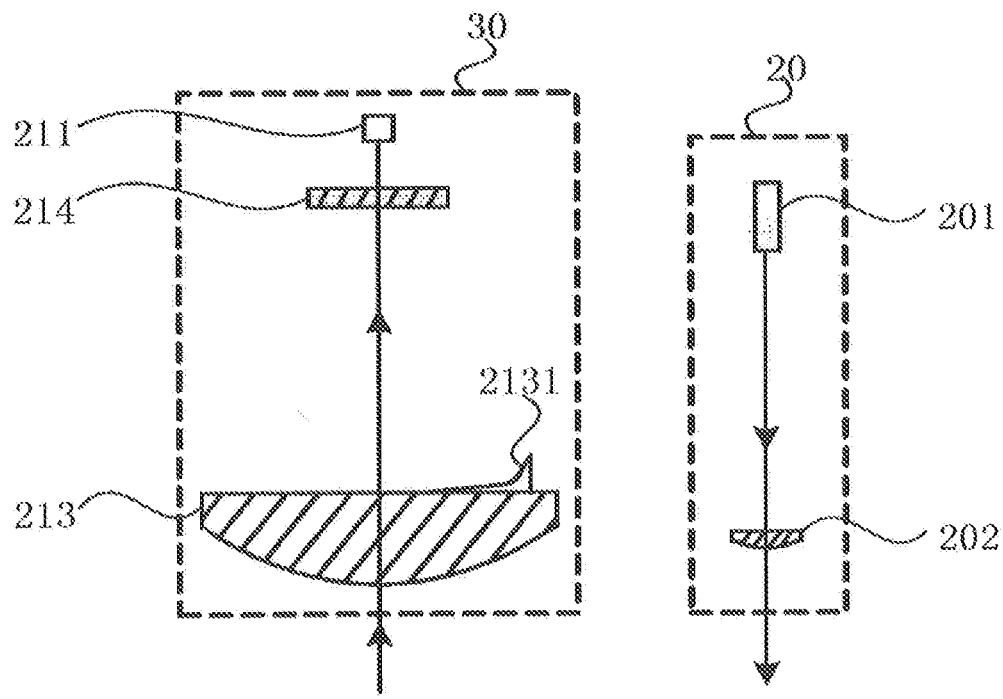
FIG. 8 is a schematic structural diagram of a laser emitting unit and a signal receiving unit provided by an embodiment of the present application.

FIG. 8 is a schematic diagram of the optical structure of a laser emitting unit and a signal receiving unit according to an embodiment. Referring to FIG. 8, the signal receiving unit 40 may further comprise a receiving lens 213 and a filter 214, and the receiving lens 213, the filter 214, and the photodetector 211 are sequentially arranged along the propagation direction of the light beam; the receiving lens 213 is configured to focus the first high-frequency echo signal and the second high-frequency echo signal to the photodetector 211; the filter 214 is configured to let the first high-frequency echo signal and the second high-frequency echo signal pass through to filter out interference signals of other wavelengths, that is, the interference signal will not be detected by the photodetector 211, thereby improving the signal-to-noise ratio of the optical signal detection module. Applying the filter 214 to the laser radar system can increase the detection range of the system under strong light.

Due to the scattering on the surface of the target object, the echo signal generated by the reflection of the target object usually diverges. Focusing the divergent echo signal to the photodetector 211 through the receiving lens 213 can enhance the intensity of the echo signal received by the photodetector.

In an embodiment, a side of the receiving lens 213 near the laser emitting unit 20 further comprises a short-distance light path compensating mirror 2131 attached to the light-emitting surface side of the receiving lens 213. The short-distance light path compensating mirror 2131 is configured to focus the echo signal generated by reflection by target objects at a short distance onto the photodetector 211, thereby reducing the blind zone caused by the non-coaxial system. Exemplarily, applying the above arrangement in the laser radar of a non-coaxial system can reduce the blind zone of the laser radar to below 20 cm.

In an embodiment, the signal processing unit 50 comprises an operation amplifier, an analog-to-digital converter, and a field programmable gate array; an input end of the operation amplifier is electrically connected to the signal receiving unit, an output end of the operation amplifier is electrically connected to an input end of the analog-to-digital converter, and an output end of the analog-to-digital converter is electrically connected to the field programmable gate array; the operation amplifier is configured to respectively amplify the first differential frequency measurement signal, the first differential frequency reference signal, the second differential frequency measurement signal, and the second differential frequency reference signal transmitted by the signal receiving unit. The analog-to-digital converter is configured to respectively convert the first differential frequency measurement signal, the first differential frequency reference signal, the second differential frequency measurement signal and the second differential frequency reference signal amplified by the operation amplifier from an analog signal to a digital signal. The field programmable gate array is configured to compare a digital signal corresponding to the first differential frequency measurement signal with a digital signal corresponding to the first differential frequency reference signal to obtain a first phase difference, and calculate a first reference distance value of the target object according to the first phase difference; compare a digital signal corresponding to the second differential frequency measurement signal with a digital signal corresponding to the second differential frequency reference signal to obtain a second phase difference; calculate a third phase difference between the second phase difference and the first phase difference, and calculate a second reference distance value of the target object according to the third phase difference; and calculate a third phase difference between the second phase difference and the first phase difference, and calculate a second reference distance value of the target object according to the third phase difference; and determine a measurement distance value of the target object according to the first reference distance value and the second reference distance value.

In an embodiment, the optical signal detection module further comprises: a power supply unit, a microprocessor unit and a high-voltage adjustment unit; a power receiving end of the signal processing unit and a power receiving end of the microprocessor unit are electrically connected to the power supply unit, respectively, a first control end of the microprocessor unit is electrically connected to the signal processing unit, a second control end of the microprocessor unit is electrically connected to the signal receiving unit through the high-voltage adjustment unit; the power supply unit is configured to supply power to the signal processing unit and the microprocessor unit; and the microprocessor unit is configured to perform control on the signal processing unit, and is further configured to adjust a voltage applied to the signal receiving unit through the high-voltage adjustment unit, so as to cause the signal receiving unit to receive echo signals with different strengths.

In an embodiment, the optical signal detection module further comprises a temperature detection unit, a high voltage detection unit and a standard voltage detection unit; an output end of the temperature detection unit, an output end of the high voltage detection unit and an output end of the standard voltage detection unit are electrically connected with an input end of the microprocessor unit, respectively; the temperature detection unit is configured to detect a temperature value of the signal receiving unit, the high voltage detection unit is configured to detect a high voltage value of the signal receiving unit, and the standard voltage detection unit is configured to detect a standard voltage value of the signal receiving unit; and the microprocessor unit is further configured to adjust a voltage output by the high-voltage adjustment unit according to the temperature value, the high-voltage value, or the standard voltage value.

Figure 9:
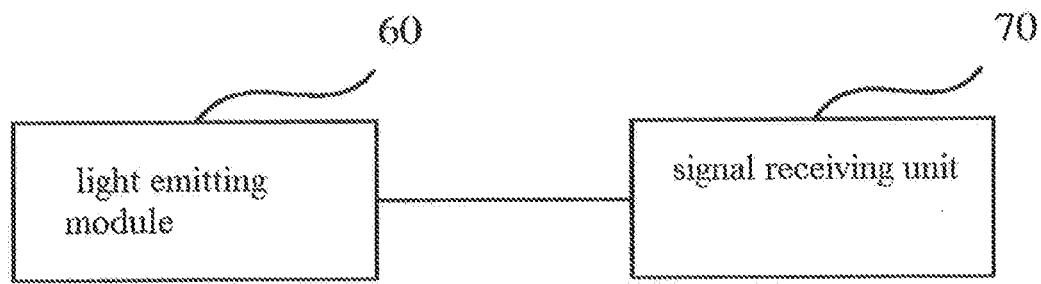
FIG. 9 is a structural block diagram of an optical system provided by an embodiment of the present application.

FIG. 9 is a structural block diagram of an optical system according to an embodiment. Referring to FIG. 9, the optical system provided in this embodiment may comprise the light emitting module 60 and the signal receiving unit 70 provided in any of the foregoing embodiments. The signal receiving unit 70 is connected to the light emitting module 60.

In this embodiment, the principles of the light emitting module 60 and the signal receiving unit 70 are the same as those in the foregoing embodiment, and will not be repeated herein.

In an embodiment, the layout of the optical path between the light emitting module 60 and the signal receiving unit 70 comprises: a coaxial system, a dual-transmitting single-receiving system, a single-transmitting single-receiving system, or a dual-transmitting dual-receiving system.

The present application also provides laser radar, which comprises a light emitting module and an optical signal detection module provided in any of the foregoing embodiments. Therefore, the laser radar provided by the embodiment of the present application has the beneficial effects of both the above-mentioned light emitting module and optical signal detection module. For the beneficial effects not shown here in detail, reference may be made to the content of the light emitting module and the optical signal detection module in the foregoing embodiments, and details are not described herein again.

Figure 10:
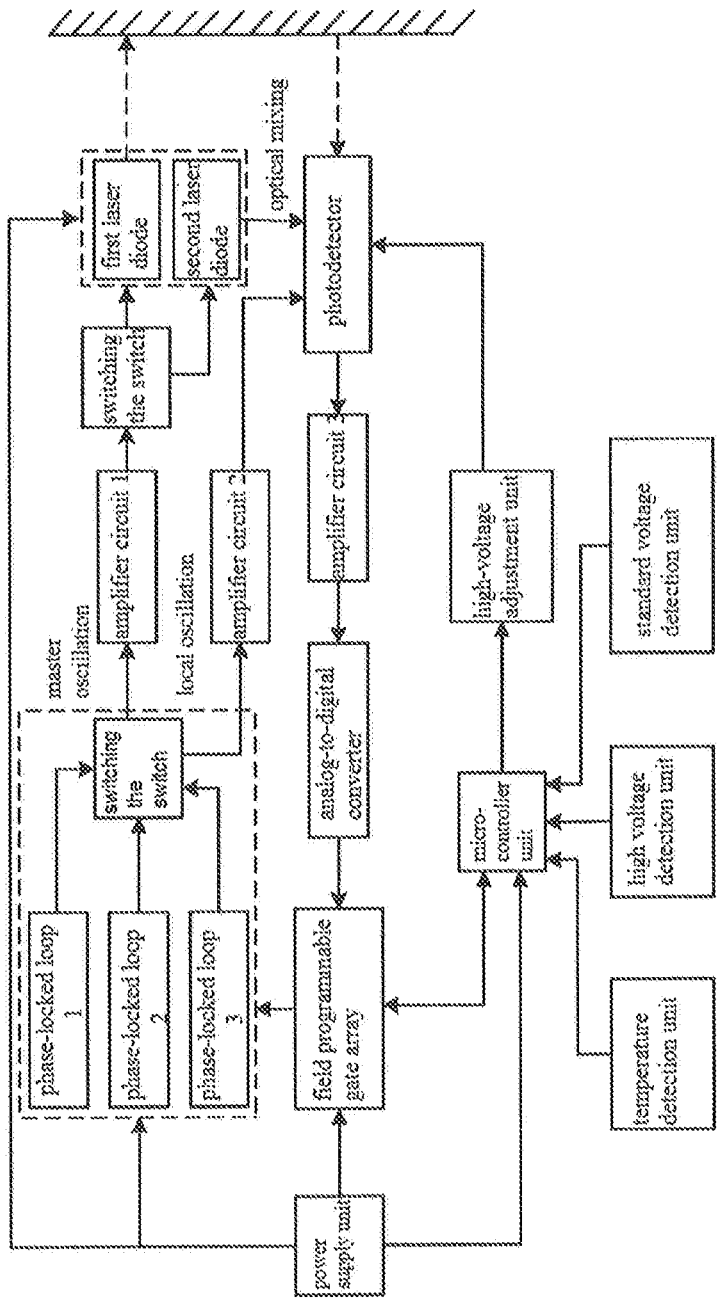
FIG. 10 is a schematic diagram of a hardware principle of a laser radar provided by an embodiment of the present application.

FIG. 10 is a schematic diagram of a hardware principle of laser radar provided by an embodiment. The principle of laser light emission and detection is described below in conjunction with the hardware structure of the laser radar. Referring to FIG. 10, the light emitting module of the laser radar comprises three phase-locked loops, the frequencies of which are switched through a switch. The high-frequency modulation signal output by each phase-locked loop comprises a master oscillator signal and a local oscillation signal. In this embodiment, for example, two phase-locked loops respectively output a first master oscillator signal and a first local oscillation signal, and a second master oscillator signal and a second local oscillation signal. Firstly, a phase-locked loop is selected with a switch to output the first master oscillator signal and the first local oscillation signal. The first master oscillator signal is selectively loaded on a first laser diode or a second laser diode after being amplified by an amplifier circuit 1. After the first master oscillator signal is loaded on the first laser diode, a first laser beam frequency-modulated by the first master oscillator signal is emitted. The first laser beam reaches the target object through an external optical path, and gets reflected back, the reflected laser beam is referred to as a first high-frequency echo signal, which also belongs to a high-frequency signal, since the transmitted laser beam is modulated by a high-frequency modulation signal.

The optical signal detection module of the laser radar comprises a photodetector. After detecting the first high-frequency echo signal, the photodetector first converts the first high-frequency echo signal into a high-frequency electrical signal. The high-frequency electrical signal is an electrical signal that is demodulated after the first laser beam modulated by the first master oscillator signal travels back and forth to the target object. There is a delayed phase difference between the high-frequency electrical signal and the first master oscillator signal. The first high-frequency electrical signal is mixed with the first local oscillator signal to obtain a low-frequency electrical signal (that is, the first differential frequency measurement signal in the above embodiment). The low-frequency electrical signal is amplified by an amplifier circuit 3 and converted by an analog-to-digital converter, to output a low-frequency digital electrical signal (represented by eD) to a Field-Programmable Gate Array (FPGA).

In order to perform phase comparison, the first master oscillator signal may be switched and loaded to the second laser diode, to emit a modulated first reference laser beam which reaches the photodetector through an internal optical path. The first reference laser beam passes through the photodetector for photoelectric conversion and is then mixed with the amplified first local oscillator signal to obtain a low-frequency first differential frequency reference signal. The low-frequency first differential frequency reference signal also undergoes amplification and analog-to-digital conversion to obtain a low-frequency reference digital electrical signal (represented by e0) for phase comparison. Since e0 does not make a round trip of the external outer optical path there is no phase delay in e0 like in eD. Therefore, the field programmable gate array performs phase comparison between eD and e0 to obtain a first phase difference for obtaining a first reference distance value of the target object, and then obtains the first reference distance value.

By switching the switch, another phase-locked loop is selected, and the second master oscillator signal, the second local oscillation signal, and the second master oscillator signal are output. Similarly, the field programmable gate array can obtain a second phase difference, and then calculate a third phase difference between the second phase difference and the first phase difference, and obtain a second reference distance value according to the third phase difference, and then obtains a measured distance value of the target object according to the first reference distance value and the second reference distance value.

In this embodiment, a switching switch configured to select a phase-locked loop is controlled by the field programmable gate array. Three phase-locked loops can output three different groups of high-frequency modulation signals, which have relatively concentrated frequency values, that is, the difference between the frequency values of each two groups is small. In this way, a unified high-frequency processing circuit can be used, allowing a simple design of the hardware circuit. Among them, the group with the highest frequency value (exemplarily, the master oscillator signal has frequency of 193 MHZ and the local oscillator signal has frequency of 192 HZ) is used as a fine ruler to ensure the measurement accuracy of the system. The other two groups (exemplarily, the master oscillator signal has frequency of 187 MHZ, the local oscillator signal has frequency of 186 MHZ, and the master oscillator signal has frequency of 167 MHZ and the local oscillator signal has frequency of 166 MHZ) are used as auxiliary rulers. The differential frequency between the fine ruler and the two auxiliary rulers (for example, the differential frequency may be 20 MHZ and 6 MHZ, respectively) can be used as a medium ruler and a rough ruler for extending the range, to ensure the measurement range of the system. It can be understood that, if only two phase-locked loops are arranged, the group with the higher frequency value serves as a fine ruler, and the other group serves as an auxiliary ruler. The difference between the fine ruler and the auxiliary ruler can be used as a rough ruler for extending the range.

On one hand, the above arrangement can reduce the configuration time of the low-frequency ruler while ensuring high accuracy and a large range, thereby improving the detection speed of the laser radar. On the other hand, because the frequency of the modulated detection optical signal is relatively concentrated, it is convenient for the circuit to process signals of similar frequencies, so that it is not necessary to separately design circuits for the high-frequency signals and low-frequency signals, so the circuit design is less difficult and the circuit structure is simple.

In an embodiment, the amplifier circuit 3 is an operation amplifier that amplifies weak signals, thereby improving the signal-to-noise ratio of the signals. Exemplarily, the operation amplifier may adopt a multi-stage amplification circuit. The first stage is for current mode signal and voltage mode signal processing, and the latter stages adopt low noise, high speed, and high precision signal amplification processing.

An input end of the operation amplifier is electrically connected to an output end of the photodetector, an output end of the operation amplifier is electrically connected to an input end of the analog-to-digital converter, and an output end of the analog-to-digital converter is electrically connected to the field programmable gate array.

In an embodiment, the analog-to-digital converter 222 is configured to quickly collect signals, and the field programmable gate array is configured to perform high-speed phase frequency calculations on the signals collected by the analog-to-digital converter (for example, a smooth filter sub-unit and a 260-point fast Fourier transform sub-unit may be integrated on the FPGA), so that the laser radar has high measurement speed, good anti-interference ability, and high precision. At the same time, the field programmable gate array can discard unstable data and only collect stable data for processing, which results in good data consistency and high data stability.

In addition, the analog-to-digital converter for high-speed signal collection and the FPGA for high-speed phase calculation used by laser radar can adopt professional tape-out technology, so that the product has higher integration, smaller area, and high reliability and stability, and thus low cost and easy miniaturization. At the same time, the boundary scan test technology of the joint test action group (Joint Test Action Group, JTAP) can reduce test cost, shorten test time, and shorten the production time of products.

Further referring to FIG. 10, the laser radar further comprises a power supply unit, a Microcontroller Unit (MCU), and a high-voltage adjustment unit; the power supply unit is electrically connected to the MCU, the FPGA, the first laser diode, and the second laser diode to realize power supply. A first control end of the MCU is electrically connected to the FGPA to achieve a variety of data interaction and program control, and the second control end of the MCU is electrically connected to the photodetector through the high-voltage adjustment unit to realize the voltage adjustment of the photodetector, so that the photodetector can amplify a variety of different reflected echo signals.

In an embodiment, the power supply unit can convert external power supply into the voltage required by multiple components of the module according to the requirements of the module and power the multiple components separately. In addition, the MCU can control the power supply unit to achieve independent power supply for multiple components in the laser radar.

In an embodiment, the high voltage adjustment unit can adjust the magnitude of the High Voltage (HV) applied to the photodetector by means of Pulse Width Modulation (PWM).

Exemplarily, in the pulse width modulation high voltage process, the larger the duty cycle, the higher the voltage value.

Further referring to FIG. 10, the laser radar further comprises a temperature detection unit (AD_NTC), a high voltage detection unit (AD_HV), and a standard voltage detection unit (AD_VBAS). An output of the temperature detection unit, an output of the high voltage detection unit, and an output end of the standard voltage detection unit are respectively electrically connected to the input end of the MCU; the temperature detection unit is configured to detect the temperature value of the photodetector, the high voltage detection unit is configured to detect the high voltage value of the photodetector, and the standard voltage detection unit is configured to detect the standard voltage value of the photodetector; the MCU is also configured to adjust the output voltage according to the temperature value and various feedback signals.

In this embodiment, in order to make the laser radar applicable to different environments, the temperature detection unit, the high voltage detection unit, and the standard voltage detection unit are designed to monitor the application environment of the photodetector, and adjust the voltage value applied to the photodetector according to the environmental information (including the temperature value, the high voltage value, and the standard voltage value).

Exemplarily, according to the influence of the temperature on the photodetector, the voltage difference compensates the change of the echo signal received by the photodetector caused by the temperature change. Exemplarily, according to the strength of the echo signal generated by the surface emission of the target object, the change of the echo signal received by the photodetector caused by the change of the intensity of the echo signal is compensated by the voltage difference. Therefore, the optical signal detection module is applicable to a variety of different environments.

In this embodiment, a constant current and constant voltage and constant power driving circuit (not shown in FIG. 10) is also used to provide a stable power supply system for the laser emitting unit (including the first laser diode and the second laser diode), while the voltage feedback of the laser emitting unit itself is used to stabilize the working point of the laser emitting unit.

In an embodiment, switching is performed by a high-speed switch, which greatly improves the switching time of the frequency. The present application can effectively improve the measurement accuracy by applying the high-speed switch (SW) to laser radar.

In an embodiment, layout of the optical path system of the laser radar comprises a coaxial system, a dual-transmitting single-receiving system, a single-transmitting single-receiving system, or a dual-transmitting dual-receiving system.

Among them, both the coaxial system and the single-transmitting single-receiving system can use relatively few components, so the cost is low; at the same time, the structure is compact and the volume is small. In the dual-transmitting single-receiving system and the dual-transmitting dual-receiving system, the reference beam (the beam corresponding to the reference optical signal) and the detection beam (the beam corresponding to the detection optical signal) do not overlap, and the optical signal has high stability.

Figure 11:
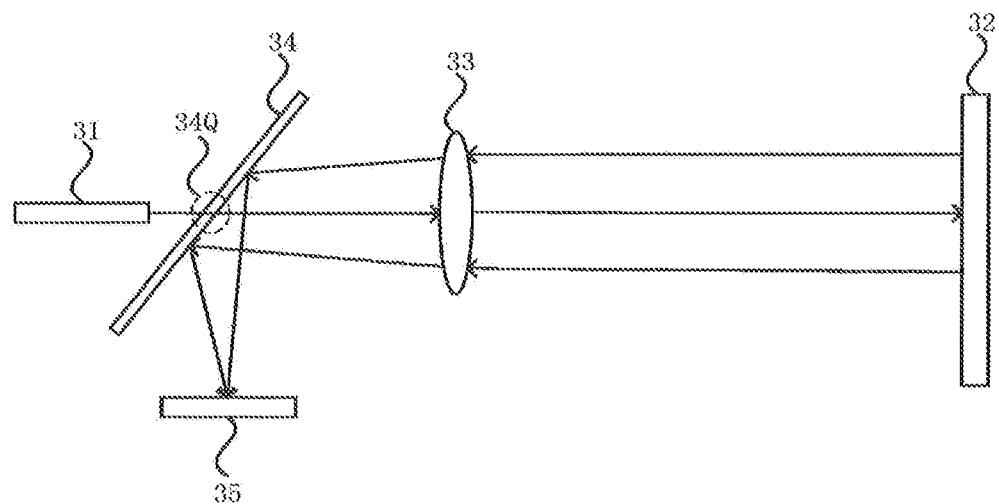
FIG. 11 is a coaxial optical system provided by an embodiment of the present application.

Exemplarily, FIG. 11 is a coaxial optical system provided by an embodiment of the present application. Referring to FIG. 11, the detection optical signal transmitted by the laser emitting unit 31 is irradiated onto the surface of the target object 32 through the small hole 34Q in the middle of the reflecting mirror 34 and the middle portion of the lens 33 sequentially, and is reflected by the target object 32 to form an echo signal. The echo signal is focused by the lens 33 and then reflected by the reflecting mirror 34 to be focused on the surface of the photodetector 35 and received by the photodetector 35.

It should be noted that although a small amount of echo signals passes through the small hole 34Q in the middle of the reflecting mirror 34 and reach one side of the light emitting unit 31, because the intensity of the echo signal is extremely small compared to the intensity of the detection optical signal, the influence of the echo signal on the detection optical signal is negligible.

Figure 12:
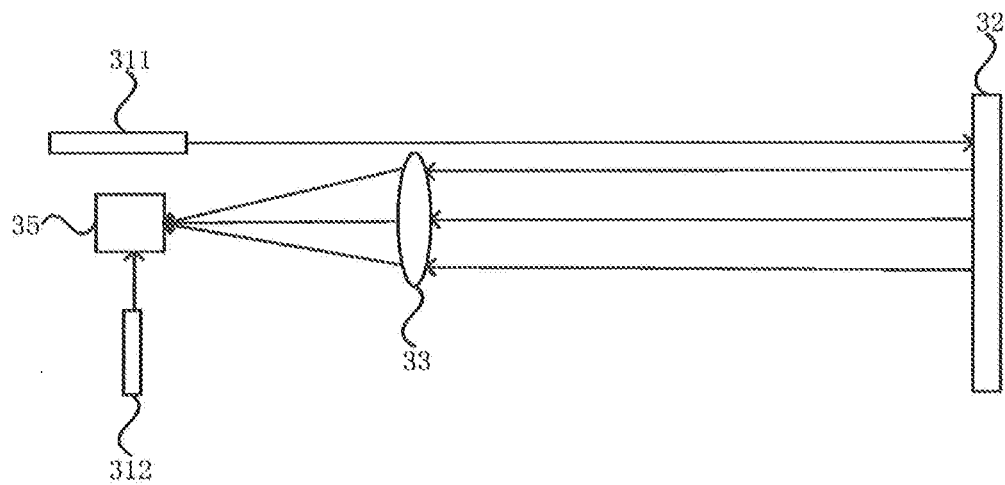
FIG. 12 is a dual-transmitting single-receiving optical system provided by an embodiment of the present application.

Exemplarily, FIG. 12 is a dual-transmitting single-receiving optical system provided by an embodiment of the present application. Referring to FIG. 10, the laser emitting unit comprises an external light source 311 and an internal light source 322. The detection optical signal transmitted by the external light source 311 irradiates and is reflected by the surface of the target object 32 to form an echo signal. The echo signal is focused on the surface of the photodetector 35 through the lens 33 and is received by the photodetector 35. The optical signal transmitted by the internal light source 312 also irradiates the surface of the photodetector 35 and is received by the photodetector 35.

It should be noted that the external light source 311 and the internal light source 312 may be comprised in the same laser emitting unit. The frequency of the detection optical signal (exemplified as 193 MHz) transmitted by the external light source 311 and the frequency of the reference optical signal (exemplified as 192 MHz) transmitted by the internal light source 312 are different from each other by a fixed value (1 MHz), thereby realizing differential frequency phase detection. The embodiment shown in FIG. 10 comprises a dual-transmitting single-receiving optical system.

Figure 13:
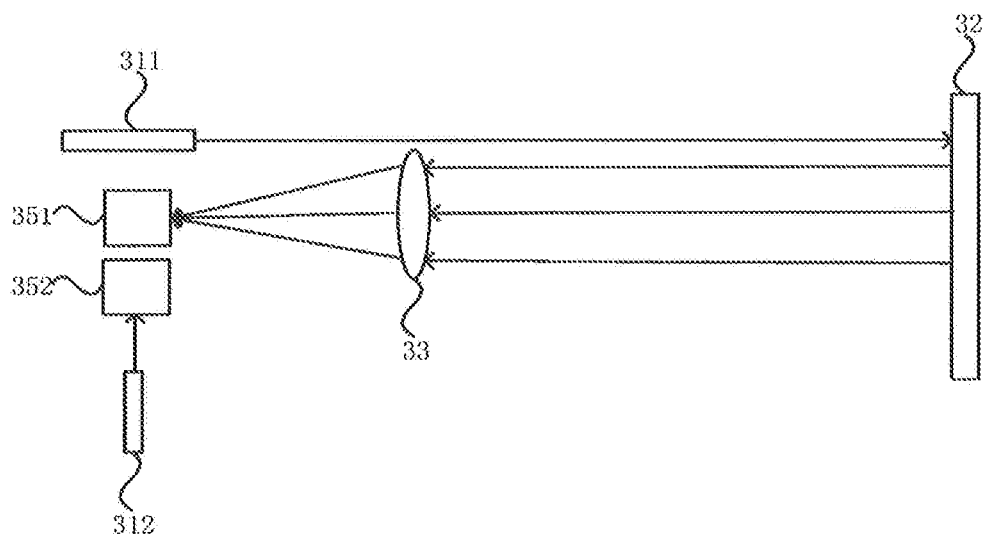
FIG. 13 is a dual-transmitting dual-receiving optical system provided by an embodiment of the present application.

Exemplarily, FIG. 13 is a dual-transmitting dual-receiving optical system provided by an embodiment of the present application. Referring to FIG. 13, the laser emitting unit comprises an external light source 311 and an internal light source 312, and the signal receiving unit comprises a first photodetector 351 and a second photodetector 352. The detection optical signal transmitted by the external light source 311 irradiates the surface of the target object 32 and is reflected by the target object 32 to form an echo signal. The echo signal is focused on the surface of the first photodetector 351 through the lens 33 and received by the first photodetector 351. The optical signal transmitted by the internal light source 312 directly irradiates the surface of the second photodetector 352 and is received by the second photodetector 352.

It should be noted that, reference may be made to the description in FIG. 12 for the external light source 311 and the internal light source 312. The first photodetector 351 and the second photodetector 352 are exactly the same. Therefore, obtaining the optical path and circuit for the echo signal and obtaining the optical path and circuit for the differential frequency reference signal are independent, and do not affect each other. Both the optical signal and the electrical signal have higher stability.

Figure 14:
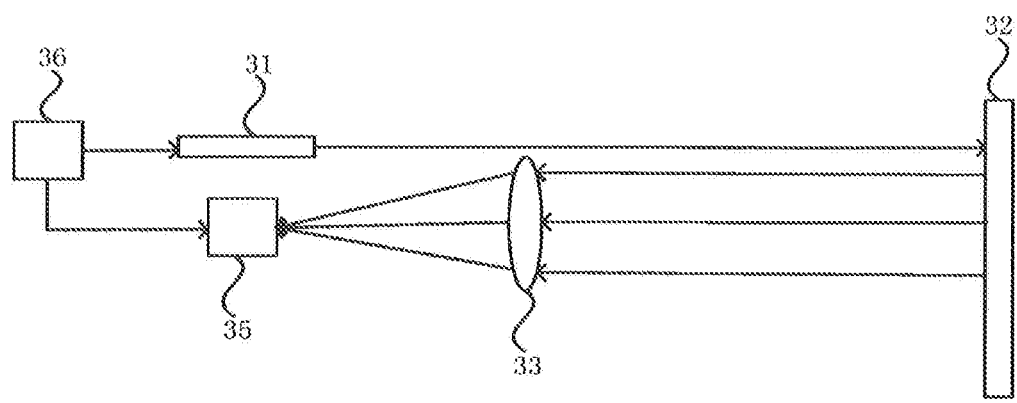
FIG. 14 is a single-transmitting single-receiving optical system provided by an embodiment of the present application.

Exemplarily, FIG. 14 is a single-transmitting single-receiving optical system provided by an embodiment of the present application. Referring to FIG. 14, the frequency-modulated electrical signal 36 is used to control the laser emitting unit 31 to emit a detection optical signal. The detection optical signal irradiates the surface of the target object 32 and is reflected by the target object 32 to form an echo signal. The echo signal is focused on the surface of the photodetector 35 through the lens 33 and received by the photodetector 35. At the same time, the photodetector 35 receives a frequency-modulated electrical signal 36. Therefore, the process of converting the modulated electrical signal into a reference optical signal and then converting it into a reference electrical signal is omitted, thereby saving time for signal processing and increasing the speed of signal processing.

In an embodiment, the laser radar further comprises an angle detection unit, and the angle detection unit is electrically connected to the signal processing unit in the optical signal detection module; the angle detection unit is configured to detect the angle value of the rotation of the laser radar; and the signal processing unit is further configured to correlate the amount of change of the distance value with the amount of change of the angle value.

In an embodiment, the light emitting module can be rotated within a range of 360 degrees, and the angle detection unit is configured to detect the rotation angle of the light emitting module, so that the laser radar can achieve horizontal two-dimensional scanning detection over 360 degrees within a range of 0.01 meters (m) to 100 meters, so as to obtain two-dimensional position information of the surrounding environment. In an embodiment, the scanning frequency of the laser radar is 3 Hz (Hz) to 10 Hz, for example, the light emitting module can rotate 360 degrees 3 times to 10 times per second; if the optical system in the laser radar is a coaxial system, the optical signal detection module and the light emitting module rotate synchronously. The detection frequency of the laser radar is 8 kHz-20 kHz, which can detect 8 k-20 k distance values per second. The angular resolution of the laser radar system is 0.18°-1°, that is, the smallest angle value that can be resolved by the angle detection unit is 0.18°-1°. At the same time, the detection accuracy of laser radar can reach millimeter level, so that this laser radar can be widely used in laser scanning systems, monitoring systems, space mapping (space modeling), collision avoidance, robotics, environmental detection and military reconnaissance.

In an embodiment, the transmission method of rotation of the laser radar comprises a brushed motor, a brushless motor, or wireless power supply.

In an embodiment, the laser radar further comprises a communication unit; the communication unit is electrically connected to the signal processing unit in the optical signal detection module; the communication unit is configured to transmit at least one of the distance value, the angle value, and an association relationship between the change amount of the distance value and the change amount of the angle value obtained by the signal processing unit to a feedback signal receiving unit.

In an embodiment, the feedback signal receiving unit may be a light emitting module, which adjusts the intensity of the transmitted detection optical signal by the above received information to be applied to different detection environments.

In an embodiment, the feedback signal receiving unit may also be a microcontroller, which is configured to further process the detected data, so as to implement monitoring of the surrounding environment or automation control.

In an embodiment, the communication mode of the communication unit may comprise: optical communication, Bluetooth communication, or WIFI communication.

In this way, data transmission in a wireless manner can reduce the number of external interfaces of the laser radar, which simplifies the structure of the laser radar while allowing the laser radar to have a wider application range, for example, application in humid or watery environment.

Figure 15:
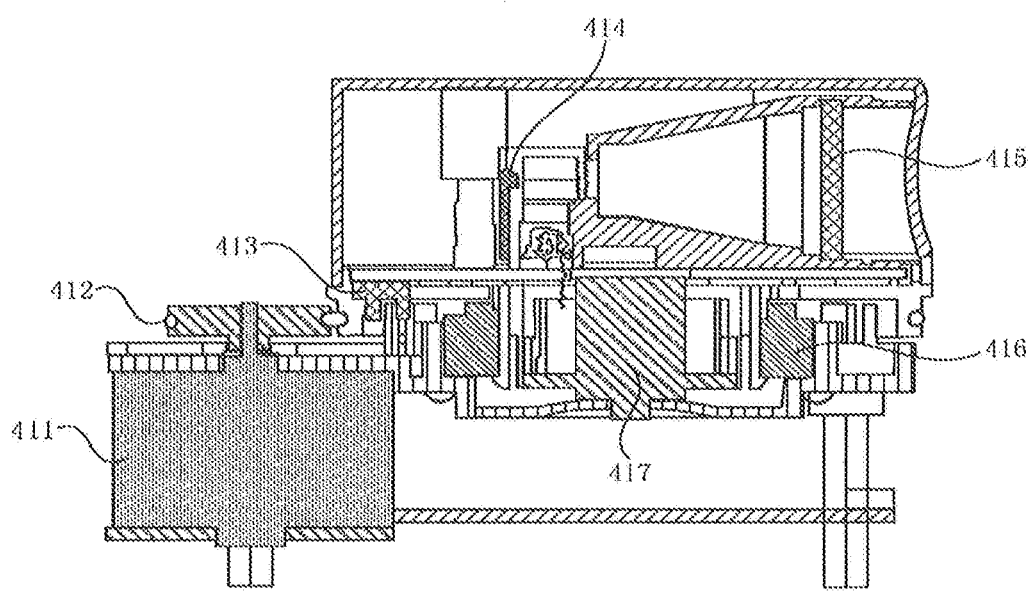
FIG. 15 is a schematic cross-sectional structural diagram of a motor belt-driven and slip-ring powered laser radar system provided by an embodiment of the present application.

Exemplarily, FIG. 15 is a schematic cross-sectional structural diagram of a motor belt-driven and slip-ring powered laser radar system provided by an embodiment of the present application. Referring to FIG. 15, the laser radar comprises a motor 411, a belt 412, an angle detection unit 413, a photodetector 414, a receiving lens 415, a bearing 416, and a slip ring 417. The motor 411 drives a rotation module (including the photodetector 414 and the receiving lens 415, and also comprises a light emitting module not shown in FIG. 15) to rotate through the belt 412. The angle detection unit 413 may be a photoelectric converter for positioning a code disc (not shown in FIG. 15), thereby detecting the rotation angle of the rotation module. The echo signal reflected by the target object passes through the receiving lens 415 and is focused on the surface of the photodetector 414 and received by the photodetector 414. The slip ring 417 is used to power the rotation module and transmit data.

Figure 16:
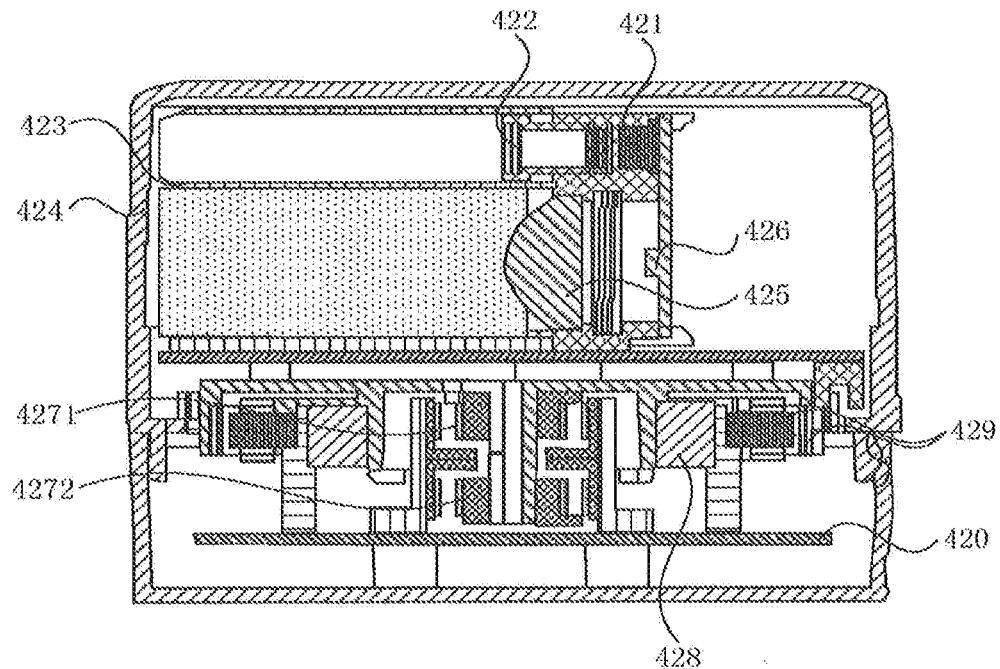
FIG. 16 is a schematic cross-sectional structural diagram of a laser radar system with electromagnetic induction power supply and wireless communication provided by an embodiment of the present application.

Exemplarily, FIG. 16 is a schematic cross-sectional structural diagram of laser radar with electromagnetic induction power supply and wireless communication provided by an embodiment of the present application. Referring to FIG. 16, the laser radar comprises a laser emitting unit 421, a collimating lens 422, a light shading tube 423, a light transmitting cover 424, a receiving lens 425, a photodetector 426, a signal transmission coupling coil 4271, an electric transmission coupling coil 4272, a bearing 428, a motor 429, and motor control 420. Exemplarily, the laser emitting unit 421 may be a laser. The light beam emitted by the laser emitting unit 421 passes through the collimating lens 422 to form a detection optical signal, and is transmitted through the light transmitting cover 424, and irradiates the surface of the target object to form an echo signal; the echo signal passes through the light transmitting cover 424 and the receiving lens 425 to be focused on the photodetector 426. The light shading tube 423 is used to isolate the detection optical signal and the echo signal, so that the two optical signals do not interfere with each other, thereby improving detection accuracy. The motor 429 is driven by the motor control 420 to rotate the rotary module. The electric transmission coil 4272 implements power supply via electromagnetic induction, and the signal transmission coupling coil 4271 implements data transmission via wireless communication.

Figure 17:
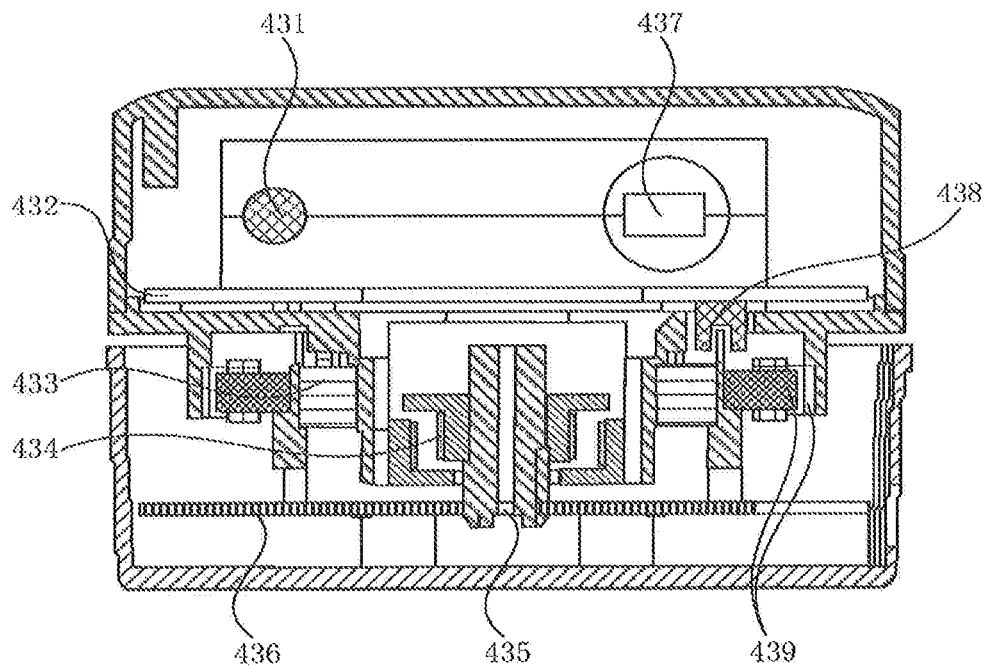
FIG. 17 is a schematic cross-sectional structural diagram of a laser radar system with wireless power supply and optical communication system provided by an embodiment of the present application.

Exemplarily, FIG. 17 is a schematic cross-sectional structural diagram of laser radar with wireless power supply and optical communication system provided by an embodiment of the present application. Referring to FIG. 17, the laser radar comprises a light emitting module 431, a first wireless signal transmission module 432, a bearing 433, a wireless power transmission module 434, a second wireless signal transmission module 435, a motor control 436, an optical signal detection module 437, an angle detection unit 438 and a motor 439. This laser radar uses wireless power supply. The first wireless signal transmission module 432 and the second wireless signal transmission module 435 work together to implement data transmission by means of optical communication. Except for the power supply mode and the communication mode, for other working processes, reference may be made to the description of FIG. 15 and FIG. 16, and details are not described herein again.

It should be noted that FIG. 15 to FIG. 17 only exemplarily show the structures of three different types of laser radars, but imposes no limitation on the embodiments of the present application. In other implementations, based on the above-mentioned basic principles proposed in the embodiments of the present application, the transmission method, communication method, and relative position relationship between a plurality of components may be selected according to actual needs.

Figure 18:
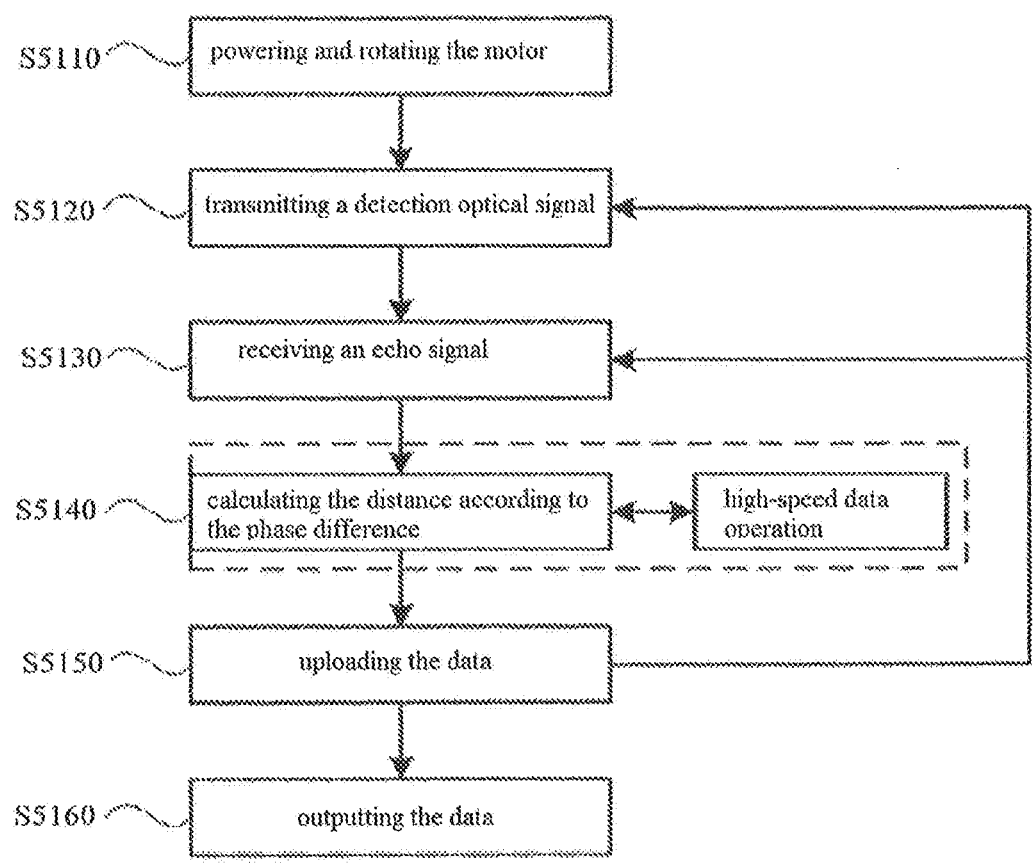
FIG. 18 is a schematic flowchart of operation of a laser radar system provided by an embodiment of the present application.

Exemplarily, FIG. 18 is a schematic diagram of a working process of laser radar provided by an embodiment of the present application. Referring to FIG. 18, the working process of the laser radar comprises the following steps.

Step S5110: powering and rotating the motor.

The rotation of the motor can drive the rotation module (mainly including the light emitting module and the optical signal detection module) to rotate, so that the laser radar can realize scanning detection within a 360-degree range.

Step S5120: transmitting a detection optical signal.

The detection optical signal may be an infrared laser beam modulated by a high-frequency modulation signal. The detection optical signal is transmitted by the laser emitting unit.

Step S5130: receiving an echo signal.

The echo signal is a reflected optical signal formed after the detection optical signal transmitted by the light emitting module is reflected by the target object. The echo signal is received by a signal receiving unit in the optical signal detection module.

Step S5140: calculating the distance according to the phase difference.

The phase difference between the detection optical signal and the echo signal is related to the distance of the target object.

Exemplarily, the phase-based distance measurement adopts the formula of:

$$D = \frac{c}{2} \times \frac{\Delta\varphi}{2\pi f}$$

Among them, D is the distance to be detected, c is the speed of light, A $\Delta\varphi$ is the detected phase difference, and f is the modulation frequency of the detected optical signal. Therefore, as long as the phase difference between the detection optical signal and the echo signal is detected, the distance to be detected can be calculated. The optical signal detection module provided in the foregoing implementation can implement high-speed data calculation, thereby enabling rapid processing of optical signals, and thereby quickly obtaining the distance to be detected.

Step S5150: uploading the data.

This step may comprise feeding back the data obtained in step S5140 to the light emitting module performing step S5120 and the optical signal detecting module performing step S5130, thereby forming a closed-loop self-feedback adjustment system, to realize adjustment of the intensity of the detection optical signal and the echo signal, improving the accuracy of the detection result.

At the same time, this step may also comprise uploading the data obtained in step S5140 to a feedback signal receiving unit, i.e., performing step S5160.

Step S5160, outputting the data.

In this step, two-dimensional detection point cloud image data can be displayed, and the output data can also be used as a control instruction to realize automatic control.

Figure 19:
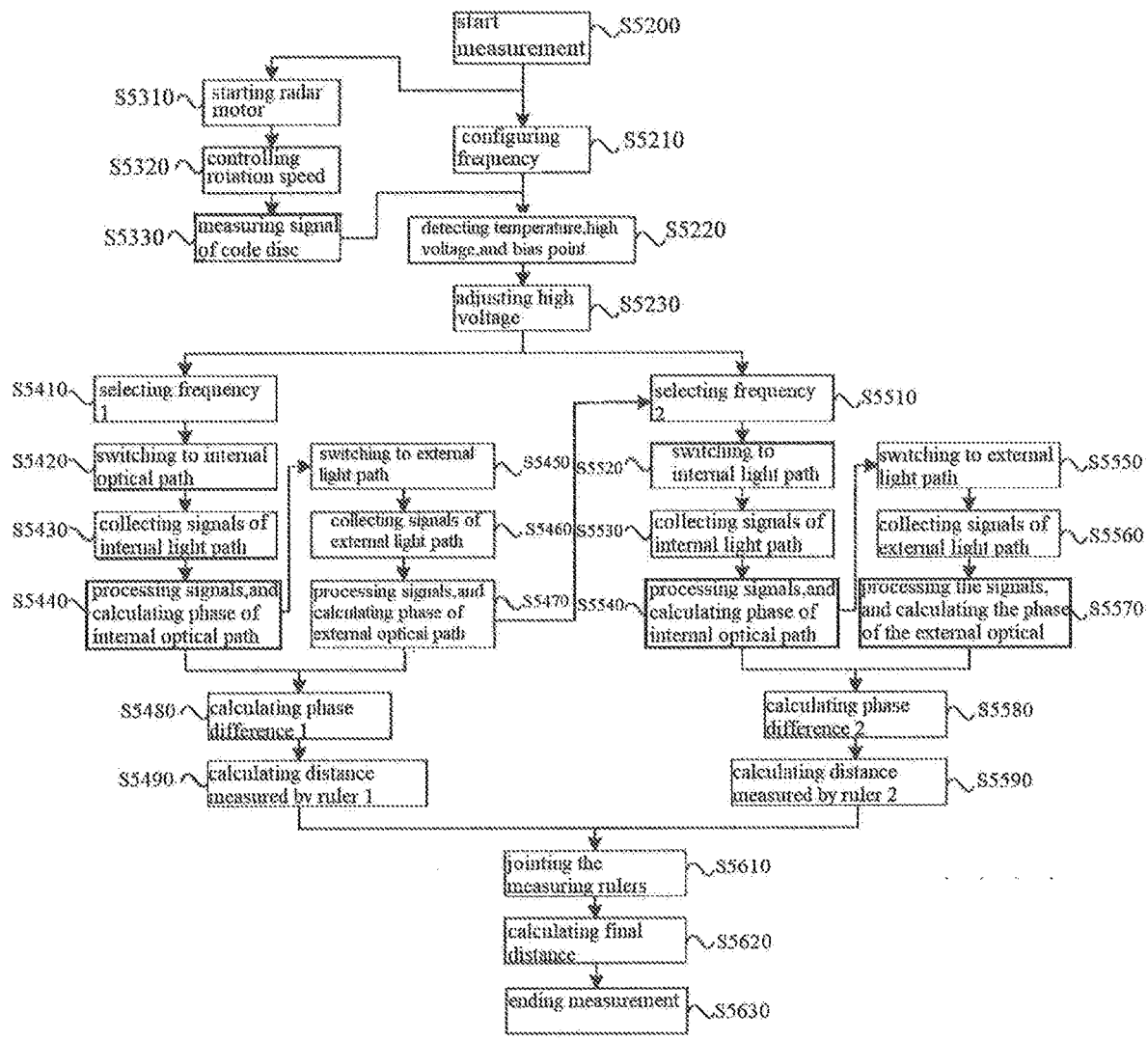
FIG. 19 is a schematic flowchart of an algorithm of a laser radar system provided by an embodiment of the present application.

Exemplarily, FIG. 19 is a schematic flowchart of an algorithm of laser radar provided by an embodiment of the present application. Referring to FIG. 19, the working procedure of the laser radar comprises the following steps.

Step S5200: starting measurement.

To achieve this step, remote control can be performed by pressing the start button in the laser radar, clicking the start button on the laser radar's screen, or by wireless transmission.

Step S5210: configuring frequency.

This step is performed by a light emitting module, and a high-frequency modulation signal outputted by a high-frequency modulation signal output unit is loaded into a laser emitting unit for modulation to form a detection optical signal having a frequency that meets a requirement.

Step S5220, detecting temperature, high voltage, and bias (Bias) point.

This step is performed by the optical signal detection module. The accuracy of the detection results in different environment can be improved by detecting the application environment of the laser radar, for example, the application environment parameters of the signal receiving unit, and subsequently adjusting the voltage applied to the signal receiving unit, i.e., performing step S5230, so that the laser radar can be applied to more test environments.

After step S5200 and before step S5220, in order to realize rotation of the laser radar, the following three steps may be comprised.

Step S5310: starting the radar motor.

The rotation of the motor can drive the light emitting module and the signal receiving unit (or the entire optical signal detection module) in the laser radar system to rotate.

Step S5320: controlling the rotation speed.

The rotation speed can be adjusted to a preset range according to the density of the detection points in each 360-degree range or the actual needs of the detection range.

Exemplarily, when the requirement for the density of detection points in each 360-degree range is low, a high rotation speed may be used; when the requirement for the density of detection points in each 360-degree range is high, a lower rotation speed may be used.

Exemplarily, the control of the rotation speed may be implemented by adjusting a button for controlling the rotation speed or entering a required rotation speed value.

Step S5330: measuring the signal of the code disc.

This step is performed by the angle detection unit. By performing this step, it is possible to detect the rotation angle and monitor the rotation speed.

After step S5220, performing step S5230.

Step S5230: adjusting high voltage.

This step can be implemented by pulse width modulation. After step S5230 is completed, the receiving unit is in a working state suitable for the application environment, and starts to transmit and receive signals, including the following steps.

Step S5410, selecting frequency 1. The selection of frequency can be realized by selecting the phase-locked loop by the FPGA controlling the switching of the switch.

Step S5420: switching to the internal optical path. Among them, the switching between the internal optical path and the external optical path can also be realized by the switch.

Step S5430: collecting signals of the internal light path.

Step S5440: processing the signals, and calculating the phase of the internal optical path.

Step S5450: switching to the external light path.

Step S5460: collecting signals of the external light path.

Step S5470: processing the signals, and calculating the phase of the external optical path.

Step S5480: calculating the phase difference 1.

Step S5490: calculating the distance measured by the ruler 1.

Generally, due to the phase-based distance measurement, the distance measured by one ruler is not accurate enough and requires the cooperation with multiple rulers. Therefore, the detection of the distance of the target object by at least one detection optical signal with a frequency different from step S5410 is also comprised, which includes the following steps:

Step S5510: selecting frequency 2. Similarly, the phase-locked loop can be selected by the FPGA controlling switching of the switch to achieve frequency selection.

Step S5520: switching to the internal light path.

Step S5530: collecting the signals of the internal light path.

Step S5540: processing the signals, and calculating the phase of the internal optical path.

Step S5550: switching to the external light path.

Step S5560: collecting the signals of the external light path.

Step S5570: processing the signals, and calculating the phase of the external optical path.

Step S5580: calculating the phase difference 2.

Step S5590: calculating the distance measured by the ruler 2.

Based on the distance measured by the ruler 1 in step S5490 and the distance measured by the ruler 2 in step S5590, performing step S5610.

Step S5610, jointing the measuring rulers.

Jointing the rulers refers to combining the distance measured by the aforementioned ruler 1 with the distance measured by the ruler 2 on one hand, and to calculating the difference between the ruler 1 and the ruler 2 to calculate a new distance value on the other hand.

Exemplarily, the ruler 1 and the ruler 2 use a software algorithm to obtain a difference frequency as a rough ruler, the distance calculated by the rough ruler is 100 m, the ruler 2 is a fine ruler, and the distance measured by the fine ruler is 0.8 m. The resulting distance by jointing the two results is 100.8 m.

It should be noted that the specific value of the distance is merely exemplary rather than limitative description.

Step S5620: calculating the final distance.

The distance obtained in step S5610 is usually a relative distance value comprising a distance error. There is a one-to-one correspondence between the relative distance value and the absolute distance value. Therefore, the absolute distance value can be obtained by looking up the table and serves as the final distance.

Step S5630: ending the measurement.

Exemplarily, corresponding to step S5200, the measurement can be ended by means of buttons, keys or remote control; or the measurement can be automatically ended by the laser radar after the detection reaches a preset threshold range. When the measurement is finished, the laser radar can be in a standby or powered off state.

It should be noted that the work flow of the laser radar system shown in FIG. 18 and the algorithm flow of the laser radar shown in FIG. 19 are executed based on the laser radar provided in the embodiment of the present application, and the steps that are not described in detail can be understood by referring to the working principles of the multiple components of the laser radar in the above embodiment, which will not be repeated here.

The invention claimed is:

1. A light emitting module, comprising:
a high-frequency modulation signal output unit, configured to output at least two preset high-frequency modulation signals with different frequencies;
a laser emitting unit, connected to the high-frequency modulation signal output unit, and configured to emit at least two laser beams with different frequencies respectively modulated by the at least two preset high-frequency modulation signals with different frequencies;
a reference signal transmitting unit, connected to the high-frequency modulation signal output unit, and configured to emit at least two reference signals with different frequencies after being respectively modulated by the at least two preset high-frequency modulation signals with different frequencies.

2. The light emitting module of claim 1, wherein each high-frequency modulation signal is a master oscillator signal;
the high-frequency modulation signal output unit is further configured to output at least two local oscillator signals with different frequencies to a signal receiving unit, the at least two local oscillator signals correspond to at least two master oscillator signals, and each local oscillator signal differs from a master oscillator signal by a preset frequency.

3. The light emitting module of claim 2, wherein the high-frequency modulation signal output unit comprises at least two phase-locked loops, and each phase-locked loop is configured to output a master oscillator signal and a local oscillator signal corresponding to the master oscillator signal.

4. The light emitting module of claim 1, wherein the laser emitting unit comprises a laser diode.

5. The light emitting module of claim 4, wherein the laser emitting unit further comprises a collimating lens, the laser diode and the collimating lens are sequentially arranged along a propagation direction of the light beam, and the collimating lens is arranged to collimate laser beams emitted by the laser diode.

6. The light emitting module of claim 2, wherein a difference between frequencies of different master oscillator signals is within a preset frequency range.

7. The light emitting module of claim 1, wherein the at least two reference signals with different frequencies are at least two reference laser beams with different frequencies or at least two reference electrical signals with different frequencies.

8. An optical signal detection module, comprising a signal receiving unit and a signal processing unit which are electrically connected;
wherein, the signal receiving unit is configured to receive a first reference signal, a second reference signal, a first high-frequency echo signal, and a second high-frequency echo signal;
the first reference signal is a reference signal modulated by a first high-frequency modulation signal, the second reference signal is a reference signal modulated by a second high-frequency modulation signal; the first high-frequency echo signal is a laser beam after the first laser beam is reflected by a target object, and the second high-frequency echo signal is a laser beam after the second laser beam is reflected by the target object; the first laser beam is a laser beam modulated by the first high-frequency modulation signal, and the second laser beam is a laser beam modulated by the second high-frequency modulation signal; and the frequency of the first high-frequency modulation signal is greater than that of the second high-frequency modulation signal;
the signal processing unit is configured to:
obtain a first reference distance value of the target object according to a first phase difference between the first reference signal and the first high-frequency echo signal; and
obtain a second reference distance value of the target object according to the first phase difference and a second phase difference, and determine a measurement distance value of the target object according to the first reference distance value and the second reference distance value; and
the second phase difference is a phase difference between the second reference signal and the second high-frequency echo signal.

9. The optical signal detection module of claim 8, wherein the first reference signal and the second reference signal are a first reference laser beam and a second reference laser beam, respectively, or a first reference electrical signal or a second reference electrical signal, respectively.

10. The optical signal detection module of claim 9, wherein the signal receiving unit is further configured to:
receive a first local oscillator signal;
convert the first high-frequency echo signal into a corresponding electrical signal, and mix the electrical signal corresponding to the first high-frequency echo signal with the first local oscillator signal to obtain a first differential frequency measurement signal;

convert the first reference laser beam into a corresponding electrical signal and mix the electrical signal corresponding to the first reference laser beam with the first local oscillator signal, or mix the first reference electrical signal with the first local oscillator signal to obtain a first differential frequency reference signal;

receive a second local oscillator signal; convert the second high-frequency echo signal into a corresponding electrical signal, and mix the electrical signal corresponding to the second high-frequency echo signal with the second local oscillator signal to obtain a second differential frequency measurement signal;

convert the second reference laser beam into a corresponding electrical signal and mix the electrical signal corresponding to the second reference laser beam with the second local oscillator signal, or mix the second reference electrical signal with the second local oscillator signal to obtain a second differential frequency reference signal;

the first high-frequency modulation signal is a first master oscillator signal, and the second high-frequency modulation signal is a second master oscillator signal, the frequency of the first master oscillator signal differs from the frequency of the first local oscillation signal by a preset frequency, and the frequency of the second master oscillator signal differs from the frequency of the second local oscillation signal by the preset frequency;

the signal processing unit is configured to obtain the first reference distance value of the target object according to the first phase difference between the first reference signal and the first high-frequency echo signal by comparing the first differential frequency measurement signal with the first differential frequency reference signal to obtain the first phase difference, and obtaining the first reference distance value of the target object according to the first phase difference;

the signal processing unit is configured to obtain the second reference distance value of the target object according to the first phase difference and the second phase difference by:

comparing the second differential frequency measurement signal with the second differential frequency reference signals to obtain the second phase difference;

calculating a third phase difference between the second phase difference and the first phase difference; and obtaining the second reference distance value of the target object according to the third phase difference.

11. The optical signal detection module of claim 8, wherein the signal receiving unit comprises a photodetector.

12. The optical signal detection module of claim 11, wherein the signal receiving unit further comprises a receiving lens and a filter, and the receiving lens, the filter, and the photodetector are sequentially arranged along a propagation direction of the light beam;

the receiving lens is configured to focus the first high-frequency echo signal and the second high-frequency echo signal onto the photodetector;

the filter is configured to filter interference signals of other wavelengths through the first high-frequency echo signal and the second high-frequency echo signal.

13. The optical signal detection module of claim 10, wherein the signal processing unit comprises an operation amplifier, an analog-to-digital converter, and a field programmable gate array;

an input end of the operation amplifier is electrically connected to the signal receiving unit, an output end of the operation amplifier is electrically connected to an input end of the analog-to-digital converter, and an output end of the analog-to-digital converter is electrically connected to the field programmable gate array;

the operation amplifier is configured to respectively amplify the first differential frequency measurement signal, the first differential frequency reference signal, the second differential frequency measurement signal, and the second differential frequency reference signal transmitted by the signal receiving unit;

the analog-to-digital converter is configured to respectively convert the first differential frequency measurement signal, the first differential frequency reference signal, the second differential frequency measurement signal and the second differential frequency reference signal amplified by the operation amplifier from an analog signal to a digital signal;

the field programmable gate array is configured to:

compare a digital signal corresponding to the first differential frequency measurement signal with a digital signal corresponding to the first differential frequency reference signal to obtain a first phase difference, and calculate a first reference distance value of the target object according to the first phase difference;

compare a digital signal corresponding to the second differential frequency measurement signal with a digital signal corresponding to the second differential frequency reference signal to obtain a second phase difference;

calculate a third phase difference between the second phase difference and the first phase difference, and calculate a second reference distance value of the target object according to the third phase difference; and determine a measurement distance value of the target object according to the first reference distance value and the second reference distance value.

14. The optical signal detection module of claim 8, further comprising: a power supply unit, a microprocessor unit, and a high-voltage adjustment unit;

a power receiving end of the signal processing unit and a power receiving end of the microprocessor unit are electrically connected to the power supply unit, respectively, a first control end of the microprocessor unit is electrically connected to the signal processing unit, a second control end of the microprocessor unit is electrically connected to the signal receiving unit through the high-voltage adjustment unit;

the power supply unit is configured to supply power to the signal processing unit and the microprocessor unit; and the microprocessor unit is configured to perform control on the signal processing unit, and is further configured to adjust a voltage applied to the signal receiving unit through the high-voltage adjustment unit so as to cause the signal receiving unit to receive echo signals with different strengths.

15. The optical signal detection module of claim 14, further comprising a temperature detection unit, a high voltage detection unit and a standard voltage detection unit;

an output end of the temperature detection unit, an output end of the high voltage detection unit and an output end of the standard voltage detection unit are electrically connected with an input end of the microprocessor unit, respectively;

the temperature detection unit is configured to detect a temperature value of the signal receiving unit, the high voltage detection unit is configured to detect a high voltage value of the signal receiving unit, and the standard voltage detection unit is configured to detect a standard voltage value of the signal receiving unit; and the microprocessor unit is further configured to adjust a voltage output by the high-voltage adjustment unit according to the temperature value, the high-voltage value, or the standard voltage value.

16. An optical system, comprising: the light emitting module of claim 1 and a signal receiving unit connected to the light emitting module;

wherein, the signal receiving unit is configured to receive a first reference signal, a second reference signal, a first high-frequency echo signal, and a second high-frequency echo signal;

the first reference signal is a reference signal transmitted by the light emitting module and modulated by a first high-frequency modulation signal, the second reference signal is a reference signal transmitted by the light emitting module and modulated by a second high-frequency modulation signal; the first high-frequency echo signal is a first laser beam after being reflected by a target object, and the second high-frequency echo signal is a second laser beam after being reflected by the target object; the first laser beam is the laser beam emitted by the light emitting module and modulated by the first high-frequency modulation signal, and the second laser beam is the laser beam emitted by the light emitting module and modulated by the second high-frequency modulation signal; and the frequency of the first high-frequency modulation signal is greater than that of the second high-frequency modulation signal.

17. The optical system of claim 16, wherein the first reference signal and the second reference signal are a first reference laser beam and a second reference laser beam, respectively, or a first reference electrical signal or a second reference signal, respectively.

18. The optical system of claim 17, wherein the signal receiving unit is further configured to:

receive a first local oscillator signal transmitted by the light emitting module; and convert the first high-frequency echo signal into a corresponding electrical signal, and mix the electrical signal corresponding to the first high-frequency echo signal with the first local oscillator signal to obtain a first differential frequency measurement signal;

convert the first reference laser beam into a corresponding electrical signal and mix the electrical signal corresponding to the first reference laser beam with the first local oscillator signal, or mix the first reference electrical signal with the first local oscillator signal to obtain a first differential frequency reference signal;

receive a second local oscillator signal transmitted by the light emitting module, convert the second high-frequency echo signal into a corresponding electrical signal, and mix the electrical signal corresponding to the second high-frequency echo signal with the second local oscillator signal to obtain a second differential frequency measurement signal; and convert the second reference laser beam into a corresponding electrical signal and mix the electrical signal corresponding to the second reference laser beam with the second local oscillator signal, or mix the second reference electrical signal with the second local oscillator signal to obtain a second differential frequency reference signal;

the first high-frequency modulation signal is a first master oscillator signal, and the second high-frequency modulation signal is a second master oscillator signal, and the frequency of the first master oscillator signal differs from the first local oscillation signal by a preset frequency, and the frequency of the second master oscillator signal differs from the second local oscillation signal by the preset frequency.

19. The optical system of claim 18, wherein a layout of the optical path between the light emitting module and the signal receiving unit comprises: a coaxial system, a dual-transmitting single-receiving system, a single transmitting single receiving system, or dual transmitting dual receiving system.

20. A laser radar system, comprising:

a light emitting module, comprising:

a high-frequency modulation signal output unit, configured to output at least two preset high-frequency modulation signals with different frequencies;

a laser emitting unit, connected to the high-frequency modulation signal output unit, and configured to emit at least two laser beams with different frequencies respectively modulated by the at least two preset high-frequency modulation signals with different frequencies; and a reference signal transmitting unit, connected to the high-frequency modulation signal output unit, and configured to emit at least two reference signals with different frequencies after being respectively modulated by the at least two preset high-frequency modulation signals with different frequencies, and the optical signal detection module of claim 8.

* * * * *